(12) United States Patent
Houbertz et al.

(10) Patent No.: US 10,809,468 B2
(45) Date of Patent: Oct. 20, 2020

(54) OPTICAL COMPONENT WITH BEAM DEFLECTION ELEMENT, METHOD FOR PRODUCTION THEREOF, AND BEAM DEFLECTION ELEMENTS SUITABLE FOR THE COMPONENT

(71) Applicant: MULTIPHOTON OPTICS GMBH, Wuerzburg (DE)

(72) Inventors: Ruth Houbertz, Wurzburg (DE); Moritz Esslinger, Wurzburg (DE)

(73) Assignee: Multiphoton Optics GmbH, Würzburg (DE)

( * ) Notice: Subject to any disclaimer, the term of this patent is extended or adjusted under 35 U.S.C. 154(b) by 174 days.

(21) Appl. No.: 15/751,770

(22) PCT Filed: Aug. 8, 2016

(86) PCT No.: PCT/EP2016/068897
§ 371 (c)(1),
(2) Date: Feb. 9, 2018

(87) PCT Pub. No.: WO2017/025515
PCT Pub. Date: Feb. 16, 2017

(65) Prior Publication Data
US 2018/0239096 A1  Aug. 23, 2018

(30) Foreign Application Priority Data

Aug. 10, 2015 (EP) .................... 15180448

(51) Int. Cl.
*G02B 6/42* (2006.01)
*B29D 11/00* (2006.01)
(Continued)

(52) U.S. Cl.
CPC ...... *G02B 6/4214* (2013.01); *B29D 11/00365* (2013.01); *B29D 11/00692* (2013.01);
(Continued)

(58) Field of Classification Search
CPC ...... G02B 6/4214; G02B 6/4215; G02B 6/43; B29D 11/00365; B29D 11/00692
See application file for complete search history.

(56) References Cited

U.S. PATENT DOCUMENTS

| 7,251,076 B1 | 7/2007 | Okada et al. |
| 7,860,144 B2 | 12/2010 | Kuhnelt et al. |
| (Continued) | | |

FOREIGN PATENT DOCUMENTS

| CN | 101551476 A | 10/2009 |
| DE | 102011101433 A1 | 10/2011 |
| (Continued) | | |

OTHER PUBLICATIONS

Mangirdas Malinauskas et al: "Femtosecond laser polymerization of hybrid/integrated micro-optical elements and their characterization; Femtosecond laser polymerization of hybrid/integrated micro-optical elements and their tharacterization", Journal of Optics, Institute of Physics Publishing, Bd. 12, Nr. 12, Nov. 11, 2010, Seite 124010, ISSN: 2040-8986, DOI: 10.1088/2040-8978/12/12/124010—already provided.

*Primary Examiner* — Mathieu D Vargot
(74) *Attorney, Agent, or Firm* — Duane Morris LLP

(57) ABSTRACT

The present invention relates to an optical component, comprising a substrate having a substrate surface (1), a radiation output element (2) situated on the substrate surface and/or a radiation input element (2) situated on the substrate surface and a beam deflection element (3) having dimensions of below 1 mm in all three spatial directions, which optical component is arranged on the radiation output or input element (2) on the substrate surface (1) and designed such that it deflects electromagnetic radiation exiting the radiation output element (2) substantially vertically with respect to the substrate surface (1) and in so doing forms a
(Continued)

beam that has a smaller or even negative angle in comparison with the exit angle that the beam leaving the radiation output element forms with the substrate surface or is oriented parallel to the substrate surface, or that it focuses electromagnetic radiation entering the beam deflection element (3) at a particular angle with respect to the substrate surface and directs it into the beam input element, wherein the beam deflection element (3) has an entry area for entering radiation and an exit area for this radiation and has at least two areas influencing the path of the radiation passing through the element, one of said areas causing a deflection in at least some of the incident radiation and the other causing the beam divergence and/or the beam form to change, wherein at least one of the entry and exit areas of the beam deflection element is in planar form, characterised in that this planar area is located at least to some extent directly on an exit or entry area of said beam output or input element. The invention also relates to a method for producing this component and to beam deflection elements suitable therefor.

10 Claims, 16 Drawing Sheets

(51) Int. Cl.
*G02B 6/43* (2006.01)
*B33Y 80/00* (2015.01)
*H01S 5/00* (2006.01)
*H01S 5/183* (2006.01)

(52) U.S. Cl.
CPC ............. *B33Y 80/00* (2014.12); *G02B 6/4215* (2013.01); *G02B 6/43* (2013.01); *H01S 5/005* (2013.01); *H01S 5/18386* (2013.01)

(56) References Cited

U.S. PATENT DOCUMENTS

| | | |
|---|---|---|
| 8,417,078 B2 | 4/2013 | Riester et al. |
| 8,422,836 B2 | 4/2013 | Riester et al. |
| 8,876,408 B2 | 11/2014 | Wohlfeld et al. |
| 2004/0175072 A1 | 9/2004 | Lam et al. |
| 2006/0239605 A1 | 10/2006 | Palen et al. |
| 2008/0044127 A1 | 2/2008 | Leising et al. |
| 2008/0083886 A1 | 4/2008 | Faklis et al. |
| 2011/0235964 A1 | 9/2011 | Masuda et al. |
| 2011/0262081 A1 | 10/2011 | Wohlfed et al. |
| 2012/0310340 A1 | 12/2012 | Knox et al. |
| 2013/0056910 A1 | 3/2013 | Houbertz-Krauss et al. |
| 2013/0230280 A1 | 9/2013 | Kadar-Kallen |
| 2013/0259423 A1 | 10/2013 | Charbonneau-Lefort |
| 2014/0299752 A1 | 10/2014 | Huang et al. |
| 2015/0355378 A1 | 12/2015 | Wolter et al. |
| 2016/0356970 A1 | 12/2016 | De Jong et al. |

FOREIGN PATENT DOCUMENTS

| | | |
|---|---|---|
| EP | 2916151 A1 | 9/2005 |
| EP | 2309294 A2 | 4/2011 |
| JP | 2005043635 A | 2/2005 |
| JP | 2005338696 A | 12/2005 |
| JP | 2008250007 A | 10/2008 |
| JP | 2011-248312 A | 12/2011 |
| WO | 2003037606 A1 | 8/2003 |
| WO | 2006012819 A1 | 2/2006 |
| WO | 2007128021 A1 | 11/2007 |
| WO | 2007128022 A2 | 11/2007 |
| WO | 2011135877 A1 | 11/2011 |
| WO | 2011141521 A1 | 11/2011 |
| WO | 2014108538 A2 | 7/2014 |
| WO | 2014108546 A2 | 7/2014 |

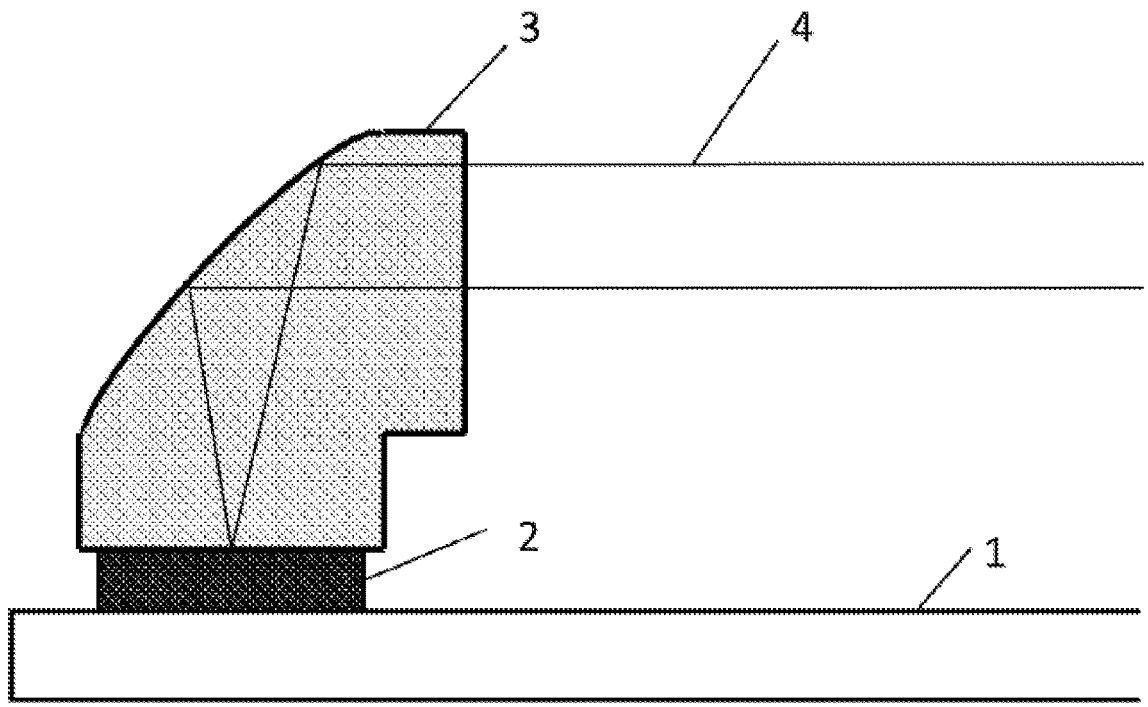
Figure 1-1    Form G
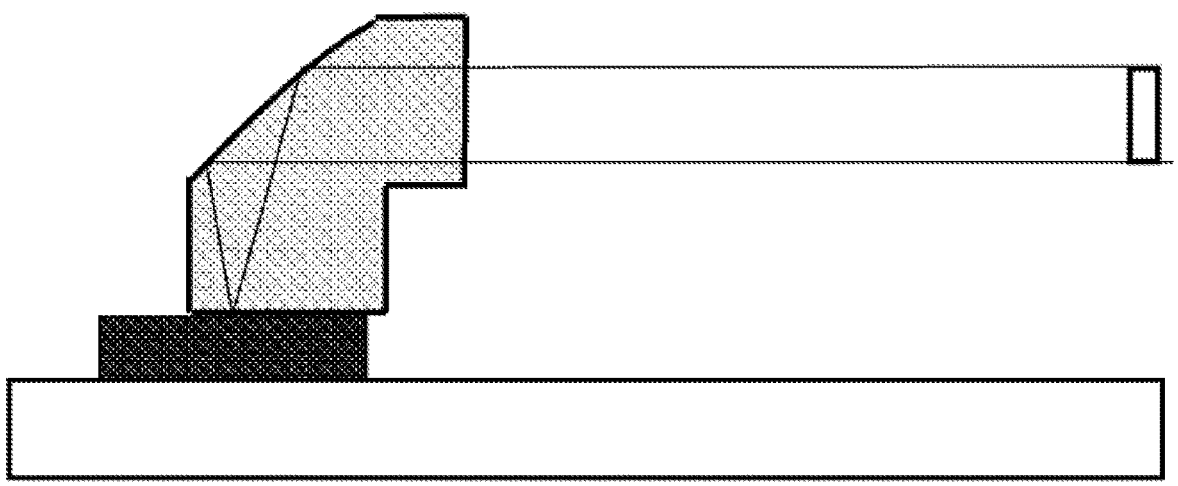
Figure 1-2    the target height is not achieved with the target diameter of the beam

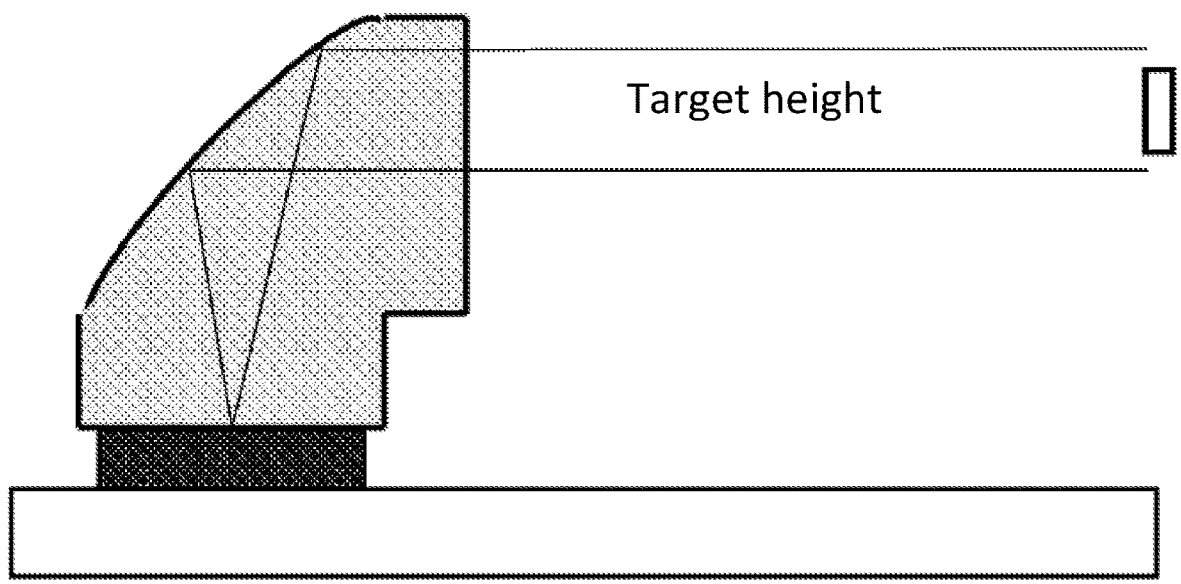
Figure 1-3    the target beam diameter is not achieved with the target height
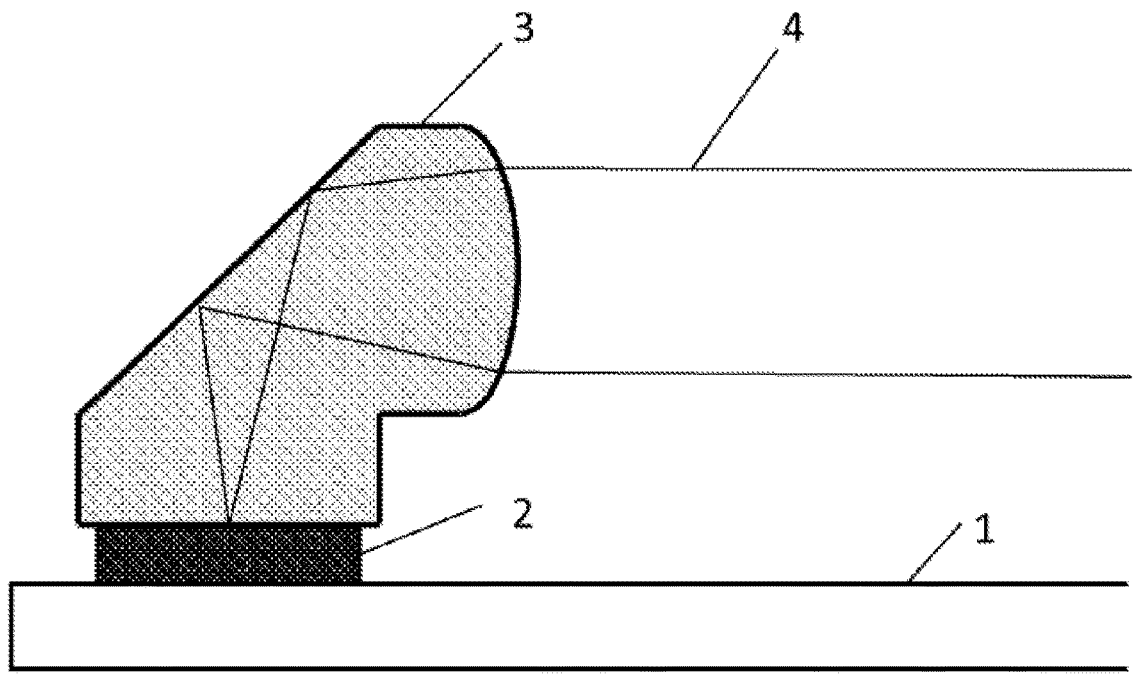
Figure 2-1    Form A

OPTICAL COMPONENT WITH BEAM DEFLECTION ELEMENT, METHOD FOR PRODUCTION THEREOF, AND BEAM DEFLECTION ELEMENTS SUITABLE FOR THE COMPONENT

The present invention relates to a (micro) optical component, which may be provided as such or integrated into a component with additional optical and/or electronic components. The component according to the invention comprises a beam deflection element, which is designed such that it can deflect electromagnetic radiation exiting a light emitting device essentially vertically or via a grid for radiation out-coupling or the like (more generally: radiation output element), or entering a detector or grid for radiation coupling (more generally: radiation input element) essentially vertically, under particularly beneficial geometric conditions from the light source and direct it into a light-receiving structure (or into the space), or deflect it from a light-emitting structure (or from the space) and direct it into the optical input. The beam deflection element is located directly on a radiation input or output of a radiation input or output element located on the optical component. Specific beam deflection elements suitable for this component are likewise comprised by the invention. The invention is also aimed at a specific production method of the components, with which it will be possible for the first time to position beam deflection elements directly on radiation input and/or output elements.

Optical or optoelectronic components normally comprise one or more radiation input or output elements, such as light-emitting devices (e.g. VCSEL, edge-emitting laser, LED), detectors, grids for light coupling, grids for light out-coupling, and beam deflectors, in a photonic chip or board. They are situated primarily on a substrate and transmit or receive electromagnetic radiation essentially vertically or at a slight angle with respect to the substrate surface. If—as is most often the case—an optical conductor, e.g. consisting of glass, is placed directly onto the radiation input or output element, it cannot be readily guided parallel to the substrate surface as this would require bending its end portion by 90°, which cannot be done in a miniaturized manner from the perspective of material technology. In the state of the art, this is done, e.g. by mounting glass fibers. Typical bending radii are in the range of 1-2 cm. Thus, the element or the component has a size of more than 1 cm according to the state of the art. As a result, the optical component cannot be designed as flat as would be desired.

To still achieve a deflection of at least a part of the radiation from the essentially vertical direction out of/into the radiation input/output element, the state of the art suggests using mirror surfaces or concave mirrors that are able to deflect the radiation by approx. 90° and, in doing so, partially collect it. Thus, JP 2005/338696 A uses a concave mirror, which is incorporated into an inclined surface of a recess, to cause a corresponding beam deflection. In accordance with US 2011/0235964 A1, a chamfered surface at the end of this waveguide is used for deflection from/into a waveguide fastened by means of clamping. An optoelectronic circuit board, which is described in JP 2008/250007, likewise comprises a waveguide the core of which is provided at its end with a mirror having a slope of 45° such that the radiation can be deflected from the waveguide by 90° into a light-receiving element. The optical substrate described in JP 1020140077533 A likewise comprises a waveguide on a surface of the substrate, where an opening with a reflective recession is provided which has a metallic coating.

US 2011/0262081 A1 describes an active optical connection consisting of at least one optoelectrical element which is connected to a substrate via a wire connection. The wire bonding is embedded into a polymerized material which forms a light-deflecting surface. By this surface, light is deflected from the optoelectrical element into a light conductor arranged transversely to its direction of radiation. This light deflection device which is formed as one piece with the inclusions for the VCSEL, contacting wire leads, wire bonds and fiber feed channels, as well as with terminal feed hopper openings, is made from UV-curing epoxy resin—namely by means of an intermediate PDMS stamp. Its surface that is exposed to the atmosphere can be flat or curved like a concave mirror such that a maximum energy coupling into the optical fiber is obtained.

A semiconductor laser component having a semiconductor laser chip provided for producing radiation and an optical device comprising a carrier, a beam deflection element arranged on the carrier, and an external mirror of an external optical resonator arranged on the carrier is described in WO 2006/012819. The beam deflection element is anodically bonded, adhered or soldered to a carrier and is designed to deflect at least a part of radiation produced by semiconductor laser chip and reflected by the external mirror. This can be a glass prism that deflects the incident radiation preferably at an angle of 90° whereby its reflector surface comprises an angle of approx. 45° with the main surface of the carrier. In an alternative, it is highly reflective for initial radiation and highly transmissive for radiation that is frequency-converted at another point, for which the reflector surface can be coated accordingly. In another alternative, it can be designed preferably as a dichroic beamsplitter.

A circuit board element having a substrate, an optical element component embedded in a layered polymerizable optical material, and a light waveguide optically coupled to it is described in WO 2007/128022 A2. A prefabricated deflection mirror is arranged on the substrate, which is embedded in the optical material. The deflection mirror can be prefabricated, for example, from silicon or from glass with a metallic coating and preferably consists of a prismatic body having a sloped or concave mirror surface. It is applied to the substrate in particular by means of adhesion. The light waveguide is structured within the photopolymerizable optical material with the help of TPA (two-photon absorption) such that it ends either directly on the deflection mirror or shortly before it.

WO 2007/128021 A1 shows a somewhat different deflection mirror. It consists of a transparent material that can be molded, for example, an inorganic/organic hybrid polymer or silicone. It has the approximate shape of a semi-sphere or has an aspheric shape and is reflected on its exterior or rear surface. It is produced in a multi-step process from an optical replication material, i.e. from a not yet permanently cross-linked hybrid polymer or silicone, which is preferably available as a sol-gel material. A transparent mask is placed onto the sol-gel material applied without a form, which has corresponding recesses, and the material is then exposed through the mask and thus hardened.

With respect to simple beam deflection faces, the concave structures suggested in the prior art have the benefit of not only being able to deflect the impinging beam, but also of bundling it. However, a disadvantage of a collecting mirror or focusing mirror remains that the light cone emitted from the beam source is deflected and focused on a single surface such that the light beams usually exit the deflection device as a parallel bundle. The height of the beam here determines the diameter of the exiting bundle. An ideal thin lens or an ideal mirror (the concave structure) does not alter the beam positions—only the directions. When the focusing element bundles the beam in parallel, the beam diameter does not change anymore after reaching the lens. Thus, it must have the target diameter already at the position of the lens or the mirror. The distance between the beam source and the lens or mirror is therefore defined. As a result, it may be necessary to choose a relatively large deflection mirror depending on the desired geometry. However, smaller deflection mirrors would be beneficial because they enable the production of more compact, smaller, and particularly lower optical components and "packages". With smaller deflection mirrors, however, it may be that either the desired target beam height or the desired beam diameter is not achieved.

An optical deflection structure having a mirror and collimator lens with dimensions from 0.5 to 1 mm in diameter is shown in the optical element circuit of US 2006/239605 A1. As a result, a light transmitted via a fiber is deflected by 90° via a collimator and then coupled into a Si IC waveguide. The IC has a Si lens focused on the side opposite the collimator lens. There is a gap between the collimator lens and the Si lens, wherein the entire height of the lens arrangement is above the rear side of the IC at less than 2 mm.

An optical element for coupling light of a fiber into a light-receiving element is shown in WO 2011/135877 A1. The element has a surface for incident light and a surface for emergent light, one of which is flat, and the other is curved. The incident light is deflected by 45° on a light-reflecting surface and directed towards the surface for emergent light. The height of the optical device can be reduced with this element.

The object of the invention is to provide optical components for coupling electromagnetic radiation with deflection elements for which, at a small construction height, the beam height and the diameter of the emitted beam can be independently adjusted or set with a minimal height. In addition, the object of the invention is to enable a further miniaturization which allows, e.g. an increase of the packaging density on the optical component or on a chip containing this component.

The object of the invention is solved by providing an optical component comprising a substrate having a substrate surface (1)

a radiation output element or radiation input element (2) arranged on the substrate surface, and a beam deflection element (3) which is arranged on the radiation input/output element (2) and is designed to deflect electromagnetic radiation exiting the radiation output element (2) essentially vertically with respect to the substrate surface (1) and, thereby forms a beam which is aligned in parallel to the substrate surface or has a smaller or even negative angle with respect to the exit angle formed by the beam exiting the radiation output element with the substrate surface, or such that it focuses electromagnetic radiation entering the beam deflection element (3) with a specific angle with respect to the substrate surface and directs it into radiation input element (2), wherein the beam deflection element (3) has an entrance face for incident radiation as well as an exit face for this radiation and at least two faces affecting the path of the radiation passing through the element, one of which causing a deflection of at least a part of the incident radiation and the other one causing a change in the beam divergence and/or the beam shape, characterized in that at least one of the entrance face and exit face of the beam deflection element has a flat or planar shape such that it is at least in part directly on an exit face or entrance face of said radiation output element or radiation input element.

The method for producing this component is characterized in that that the beam deflection element (3) is produced by a photo-induced curing of a photostructurable material directly on site from a suitable and usually small amount, e.g. a droplet, of the raw material on the optical component. For the first time, this allowas to arrange this deflection element or out-coupling or coupling element directly on a radiation output element and/or radiation input element without requiring an adhesive or any other support structure.

This method reduces the overall height by the height of the adhesive with which separately fabricated beam deflection elements to date had to be mounted on the radiation output/input element. This adhesive is also relevant for beam path control; its optical properties must be taken into account when calculating the beam path. Thus, the elimination of the adhesive through the method according to the invention not only results in a further overall height reduction but also to a simplification of the production process of the entire component. The adjustment is purely passive; it takes place at the maximum signal since the curing occurs as a result of entry of light.

In preferred embodiments of the invention, the beam deflection element is produced with the help of two-photon or multi-photon absorption (TPA, MPA), as presented in further detail below.

Finally, the invention also relates to specific beam deflection elements suitable for the present invention. These beam deflection elements are provided to be arranged on a radiation output and/or input element of an optical component, e.g. a photonic chip or even a photonics integrated circuit (PIC), and therefore have dimensions of less than 1 mm, preferably less than 600 µm in each of the three spatial directions. The beam deflection elements have an entrance face for the incoming radiation as well as an exit face for this radiation and are designed such that at least either the entrance face or the exit face has a flat shape so that it can be positioned on an exit or entrance face of a radiation output or input element. The entrance face and the exit face are arranged with respect to each other at an angle which is preferably between 70 and 110°, more preferably between 80 and 100°, and particularly preferably at approx. 90°. However, the angle can also be less than 70° in special instances. The beam deflection elements have at least two faces affecting the path of the radiation passing through the element, one of which causes a deflection of at least a part of the incident radiation and the other one causes the beam divergence and/or beam shape to change. They are distinguished by the fact that either:

(a) that surface which causes a change to the beam divergence and/or the beam shape is a diffractive optical element, a lens, a lens combination, a surface hologram, a volume hologram, a metamaterial or a combination of more of said elements on the inside of the beam deflection element, or that this face is a diffractive optical element on a reflective face of the beam deflection element, wherein the entrance face for the incident radiation and the exit face for this radiation preferably have an angle of between 70 and 110°, more preferably between 80 and 100°, and particularly preferably at approx. 90°, or (b) they have a two-part or multi-part design, wherein a face of a first part of the beam deflection element has a flat shape so that it can be positioned on an exit face or entrance face of a radiation output or input element, and wherein the second part of the beam deflection element is designed to be arranged on a substrate, wherein the first part of the beam deflection element has a face which causes a deflection of at least a part of the incident radiation, and the second part of the beam deflection element has a face which causes the beam divergence and/or beam shape to change, or vice versa, or (c) they have an entrance face for incident radiation as well as an exit face for this radiation which are parallel to each other and preferably in the same plane, comprising at least two faces which cause a deflection of at least a part of the incident radiation, and at least two surfaces which cause the beam divergence and/or beam shape of the incident radiation to change, wherein these surfaces are arranged to each other in such a way that the beam from the radiation output element can be guided through the beam deflection element into the radiation input element, wherein particularly (c') each of the at least two faces which cause the beam divergence and/or beam shape to change are a component of a lens, a sequence of two or more lenses, a Fresnel zone plate, a grid, a diffractive optical element, a thin hologram, a volume hologram or a metamaterial, or (d) they have at least one beamsplitter on their inside which causes the light radiation exiting the radiation output element to split into two or more parallel partial beams or into partial beams pointing in different spatial directions, or they have a device for combining the beams, wherein, in the event of splitting, the light radiation is split or combined spatially and/or according to wavelengths.

According to the invention, "the faces affecting radiation" mean the following elements: an optically effective interface of the element (a) to the ambient atmosphere (e.g. air) or (b) to a material surrounding the beam deflection element, e.g. that of a light conductor, wherein the optical effectiveness is based on the difference of the refractive index of the material of which the element consists at least at this interface, with respect to the refractive index of the environment, or (c) an optically effective interface within the element which can be caused, for example, by two materials with different refractive indices coinciding within the element.

According to the invention, the expression "at least partially directly on an exit face or entrance face" means that the respective beam deflection element must be arranged on this face at least to the extent that guidance of the beam is possible as described above. In this regard, it can be arranged entirely (and of course directly) on this surface; however, it can also potentially protrude such that a part thereof is not arranged on this face.

Herein, "optically effective" means that the above-mentioned interfaces affect the direction of light beams in a bundle of rays, i.e. they have a refractive power, e.g. by means of diffractive elements, refractive elements or reflective elements. A single interface can perform many of these functions and at the same time also act, e.g. as a beamsplitter.

According to the invention, "to focus" is normally intended to mean the act of causing a change to the beam shape, wherein the beams behind the face effecting the focusing (the surface with the refractive power) extend towards a focal point (converging beam). In some cases, however, the term is also used in a broader sense of a general change of the beam shape, e.g. a beam expansion (diverging beam). The respective meaning readily becomes clear for a person of ordinary skill in the art of optics.

According to the invention, "collimation" normally means a parallelization of the beam. However, this term is also used more broadly in some contexts of the invention, which a person of ordinary skill in the art will readily recognize.

A reflection of a reflective interface can be caused solely based on the specified refractive index difference; alternatively, the respective face of an exterior outer face of the deflection element can be, e.g. a face coated with a reflective metal.

By separating the functions of deflection and focusing to two non-identical faces, the beam height and the diameter of the beam can be determined independently according to the invention. Moreover, the optics can achieve enhanced imaging performance if the micro-optical component has at least two faces with refractive power. The enhancement may consist in particular in:

A higher overall refractive power of the system,
A higher tolerance towards production tolerances,
A color correction, e.g. by combining a diffractive optical element (DOE) and a lens, and/or
A compensation of positioning errors of the deflection element on the substrate or on the radiation output/input element through optics corrected for finite fields.

The invention will be explained in further detail below based on the beam guidance of embodiments for which the optical element has a radiation output element on which the beam deflection element is arranged. In this regard, the radiation originating from the radiation output element enters the beam deflection element, is deflected there, and thereby forms a beam which has a smaller or even negative angle or is aligned in parallel to the substrate surface with respect to the exit angle of the beam exiting the radiation output element with respect to the substrate surface. The beam formed by the deflection element can be a parallel or focused (including, in some cases, an expanded) beam bundle.

However, it should be clear that the explanations relating to these embodiments should also apply vice versa to those embodiments in which strikes the beam deflection element from outside and is directed (coupled) into a radiation output element arranged on the substrate. In these instances, the impinging beam is deflected and focused such that it can enter into the radiation output element.

The substrate may be any substrate conventionally used for optical or photonic purposes, e.g. a circuit board, a rigid or flexible substrate, e.g. a film, particularly consisting of an organic polymer, or a chip, for example, a silicon chip, an InP chip or a triplex chip, or in general a photonic integrated circuit. At least one radiation output element or radiation input element is arranged on a surface of this substrate. The radiation output element can be selected from among active elements, such as light emitters (e.g. lasers, VCSELs, LEDs), and passive elements, which transfer light fed to them, e.g. grids for light out-coupling or (glass) deflection mirrors in the substrate. The radiation input element can likewise be selected from among active elements (e.g. sensors, detectors) and passive elements, such as grids for coupling in light, or deflection mirrors in the substrate. In any case, the radiation output and input elements used according to the invention have in common that they couple-in or couple-out light vertically or essentially vertically with respect to the face of the substrate or at a small angle to the perpendicular direction, preferably less than 20°, particularly preferably less or equal to 10°. In individual cases, the substrate and the radiation output element are identical, for example, in the case of an LED which simultaneously serves as a substrate and emits light. The substrate can potentially have at least two radiation output elements or at least two radiation input elements or at least one radiation output element and one radiation input element. The components used according to the invention can be allocated preferably to micro-optics, i.e. they have as small dimensions as possible.

The beam deflection element according to the invention is arranged directly on the radiation output/input element or on at least one of them, usually in such a manner that it abuts with a flat face to the or a flat surface of the radiation output/input element and usually slightly protrudes beyond it.

The beam deflection element is formed from one or more materials which have a refractive index suitable for the desired purposes. This is often and advantageously 1.50 or more, although in some cases less. The suitable materials and production options are specified further below. The size is likewise selected in a way corresponding to the purpose; however, it should be noted that the invention enables the use of very small beam deflection elements which have, for example, height dimensions in the range of less than approx. 1 mm to 500 µm, preferably of less than approx. 300 µm. In the "single" or "simple" forms explained in further detail below, exemplary beam deflection elements have dimensions of approx. 200 µm or less, partially even only approx. 100 µm in height and approx. 150 µm in width, and the "combined" forms have a similar height but a greater width. The low height of the beam deflection element according to the invention enables the production of optical components which require extremely little space which enable an extremely precise guidance and control of light due to the aforementioned reasons.

In all embodiments of the invention, the beam deflection element is formed in such a way that the electromagnetic radiation exiting the radiation output element (which normally has a beam angle of approx. 7-10° strikes (in most cases, though not always, first) a flat or curved interface of the beam deflection element having at least partly reflective properties. This face can be flat or curved, i.e. it can additionally have collimating or focusing (as well as beam-expanding) properties. This face is usually an outer face of the beam deflection element and may be mirrored in order to enhance the reflective effect. In a specific embodiment of the invention, this surface serves as a beamsplitter, i.e. a part of the radiation is reflected and another part, being refracted, exits the beam deflection element at this point. In an alternative specific embodiment of the invention, this surface is diffractive, i.e. it can be designed, e.g. as a grid or as a phase plate similar to a Fresnel zone plate or as a DOE or it can have the form of a volume-structured refractive index modulation (hologram, metamaterial).

When radiation strikes said optically effective surface affecting the radiation, at least a part thereof is guided to the inside of the beam deflection element.

If the beam strikes this face first, the part directed into the inside will again be reshaped according to the invention when exiting the beam deflection element. This frequently occurs using a lens-shaped element, wherein either the (or the last one in case of the multi-component beam deflection elements described in further detail below) exit face of the beam deflection element is curved and/or the beam is passed through a lens arranged inside of the element which consists of a material with a different refractive index. The curvature of the lens can be selected in combination with the refractive index difference between the material of the deflection element and that of the outer environment in such a way that a parallel beam bundle, a converging or a diverging beam exits the element. A first alternative to this involves a non-curved exit face. This is possible when the refractive index difference between the material of the deflection element and that of the outer environment causes an additional deflection, for example a (stronger) convergence of the beam bundle compared to its form on the inside of the deflection element, in conjunction with the angle with which the beam strikes this surface. In other specific embodiments the beam inside the deflection element is beam-shaped or focused through a diffractive optical element, a lens, a lens combination, a thin hologram, a volume hologram, a metamaterial (a microscopic material structured on a wavelength or subwavelength scale) or a combination consisting of more of these elements. This element can alternatively or additionally have a wavelength-dependent optical effect.

In some embodiments of the invention, the beam is first guided through the aforementioned element or the respective element combination and only then reaches the flat or curved interface of the beam deflection element having at least partially reflective properties, described above.

In a specific embodiment of the invention, the beam deflection element is designed as two-part or multi-part, wherein a first part is arranged directly on the or on at least one of the radiation output/input elements as described above for the entire beam deflection element and usually protrudes slightly beyond it. A second part is arranged on a position on the surface of the substrate such that it is located directly in the beam path of the radiation exiting the first part (or at least a part thereof). In these embodiments of the invention, the at least the two faces affecting the path of the radiation passing through the element are distributed to both parts so that the part located on the radiation output/input element (in most cases) comprises the face which causes the deflection of at least part of the incident radiation, while the other face which causes the beam diameter to change is located at the second part of the deflection element (in some cases this may be vice versa). In particular, the first part of the deflection element can be formed very simply in these embodiments with exclusively flat surfaces, one of which serves to refract the beam as described above. The second part can then be, e.g. a lens which may be arranged on a suitable collar or a respective lens sequence shaping the beam exiting the first part. The beam can exit the single lens or the last lens as a parallel beam, as a converging beam or as a diverging beam.

In another specific embodiment of the invention independent thereof, a radiation output element and a radiation input element are located on the surface of the substrate. One beam deflection element is arranged on both elements, wherein both deflection elements are aligned to each other in such a way that the beam exiting the one beam deflection element enters into the other beam deflection element. In this variation, it is preferred that the beam exiting the first beam deflection element constitutes a parallel beam bundle. Both deflection elements may have an identical geometry, without this being a necessary criterion, and are therefore capable of guiding radiation emitted from the radiation output element into the radiation input element.

In one specific variation to this embodiment, both beam deflection elements are arranged on radiation input or output elements which are not located on the same substrate surface, but rather, e.g. on the substrates of two optical components arranged next to each other, which are mounted on a chip or other substrate having e.g. additional electrical and/or optical components. The deflection elements serve in this specific variation to introduce light which exits from the first optical element into a detector or a grid for coupling-in light on the second optical element. Both deflection elements may be geometrically identical or different in this embodiment as well.

The embodiments of the inventions explained above are beam deflection elements that are termed "simpe" herein. The invention additionally comprises so-called "combined elements".

This does not include the aforementioned multi-component elements but rather elements in which the necessary functions and geometries of the "simple elements" occur twice—and frequently, though not necessarily, in a symmetrically identical form. Thus, they can be formally defined as composing two "simple" elements.

In a specific embodiment, a combined element is provided which is arranged on a radiation output element and a radiation input element as described for the "single" elements. In these cases, the beam bundle exiting the output element preferably strikes a first—flat or curved—interface of the beam deflection element having at least partially reflective properties. This face is normally an outer face of the beam deflection element which can optionally be mirrored for enhancing the reflection effect. In a specific embodiment of the invention, this face acts as a beam-splitter, i.e. a part of the radiation is reflected and another part exits the beam deflection element at this point while being refracted. In an alternative specific embodiment of the invention this face is diffractive, i.e. it is formed e.g. as a phase plate, grid or DOE.

When the radiation strikes the above-described optically effective face which affects the radiation, at least a part thereof is guided to the inside of the beam deflection element. In the most common form of this embodiment, the reflective surface is curved and imparts the beam with the form of a parallel beam bundle which runs parallel to the substrate surface in the beam deflection element until it strikes an opposing, optionally mirrored outer face of this element which has the same geometry as the first outer face. This face reflects and collimates or focuses the beam in the direction of the radiation input element. Thus, this combined element serves to guide the beam emitted from the radiation output element into the radiation input element.

In a less simple form of this embodiment, the beam on the inside of the beam deflection element strikes a second face which changes the beam diameter. This face is preferably a part of a lens consisting of a material that differs from the other material of the element and has a refractive index different than this material, wherein the beam exits once again on the other side of the lens. Through the lens, for example, a diverging beam exiting the mirror can be focused. This beam is then guided to the opposite reflective surface, as described above for the "single elements", and ultimately enters the radiation input element.

In place of the lens embedded in the beam deflection element, a sequence of lenses or a different optical element can also be provided, for example, a Fresnel zone plate, a grid, a diffractive optical element, a thin hologram, a volume hologram or a metamaterial.

In yet another design of this embodiment, the combined element serves not as a beam guide for radiation exiting the radiation output element to a radiation input element on the same substrate, but rather to a radiation input element on a second substrate. AS to the effect, it can be referred to above-described embodiment for which two beam deflection elements facing each other are arranged on different substrates.

Also in these embodiments of the invention, the beam can first be guided through the aforementioned element or the respective element combination, and only then strikes the flat or curved interface of the beam deflection element having at least partially reflective properties. A second such element or an element combination of this kind can be provided; however, it may also be omitted.

In a number of embodiments of the invention, the beam deflection element has recesses or undercuts. These designs cannot be achieved with the production methods previously suggested for beam deflection elements. However, a number of production methods applicable according to the invention can be used to achieve such designs.

Undercuts are, e.g. necessary, when the beam deflection element has a lenticular vertical exit face. All combined elements advantageously have a recess in the area between the faces with which these elements rest on the radiation input element and on the radiation output element. This area is not required for the beam guidance; the recess saves material and facilitates a precise positioning. Furthermore, additional surfaces are available in these embodiments which can have a curved design and can be used for beam shaping due to their refractive force, or generally support an optical functionality. This similarly applies for beam deflection elements comprising additional optical elements, which frequently involve an expansion of the deflection element in the direction of the beam (primarily parallel to the substrate surface in most cases): the area of the deflection element facing the substrate surface is not necessary here either for optical purposes.

The beam exiting the beam deflection element can have any shape in view of the multitude of available possible geometric shapes and refractive index differences; it can be divergent or convergent and have any diameter within the geometrical possibilities. The beam profile and the wave front are neither geometrically restricted. Moreover, the beam can be split, and it is possible to split a beam into two or more partial beams that are parallel or pointing in differing spatial directions; conversely, multiple beams can be merged (multiplexing). A beam-splitting may also be carried out according to wavelengths.

The beam deflection element according to the invention is frequently used to guide radiation from a radiation output element into a waveguide (light conductor) (or vice versa). The waveguide can be adjoined directly to a (mostly flat) surface of the beam deflection element; the light beam can also be guided through an intermediate medium, e.g. air or an embedding material, before reaching the entrance of the light conductor. The radiation can have any wavelengths of the electromagnetic spectrum; wavelengths of 1550 or 1310 nm as well as in the visible range or at 850 nm, optionally also at 980 nm, can be applied. Materials, which are highly transparent at these wavelengths, are known and are already frequently used. The beam deflection element according to the invention can be used particularly for the following tasks:

(a) Out-coupling and collimation of light from a grid coupler on a photonic chip or a photonic integrated circuit into a fiber
(b) Out-coupling and collimation of light from an electro-optical element light emitter into a fiber
(c) Out-coupling and focusing to convergent light as well as coupling into a fiber (from a grid coupler on a photonic chip or a photonic integrated circuit)

(d) Out-coupling and focusing to convergent light as well as coupling into a fiber (from an electro-optical element light emitter)

(e) Out-coupling of light from a VCSEL and focusing on a detector (f) Coupling of light from a grid on a photonic chip into another grid on the same photonic chip or a photonic integrated circuit (g) Coupling of light from a grid on a photonic chip into another grid on another photonic chip or a photonic integrated circuit (h) Coupling collimated light from a fiber into a detector (i) Coupling collimated light from a fiber into a grid (j) Coupling divergent light from a fiber into a detector (k) Coupling divergent light from a fiber into a grid.

The beam deflection element of the present invention can be produced from various optically suitable materials which are particularly also highly transmissive for the abovementioned wavelengths and thus demonstrate only a very low damping behavior. This includes glasses, organic polymers, as well as inorganic/organic hybrid polymers that mostly contain, in addition to organically polymerized groups, an inorganic network of Si—O—Si bonds wherein a part of the Si atoms can be replaced by other metal atoms. These hybrid polymers are known in the state of the art. Other materials can also be used depending on the manufacturing technology. These materials preferably have refractive indices in the range between 1.3 and 1.6, wherein primarily some purely organic materials can have relatively low refractive indices, while inorganic/organic hybrid materials normally have refractive indices between 1.40 and 1.9 and preferably from 1.45 to 1.6, depending on the (specifically adaptable) design. Glasses may have even higher refractive indices, e.g. if they contain heavier metal ions, such as titanium.

It is known in the art how to produce beam deflection elements separately, e.g. from an embossable material. The embossing may be made directly on the optical component; polymers which can be subsequently cured are suitable to this end, as is known from WO 2007/128021 A1 or U.S. Pat. No. 8,876,408 B2. Alternatively, the deflection element can be produced separately, for example from glass or a polymer, and then mounted at the desired location, e.g. by means of adhesion.

An additional option consists in the production of $SiO_x$ powder by means of laser sintering in 3D printing or by means of 3D printing with organic polymers or inorganic/organic hybrid polymers. Herein, after each coating application or after the application of material is completed, curing (and in some cases structured curing) with light (e.g. UV light) is normally conducted. In addition, annealing steps can be utilized to preliminarily or subsequently cure the total volume. The resulting glass or polymer bodies can then optionally be polished.

The use of photostructurable materials is beneficial. These can be, for example, organic polymers such as addition polymers (acrylates, methacrylates, polymers or epoxy polymers containing vinyl, allyl or styryl groups), or inorganic/organic hybrid polymers having an inorganic network (usually with Si—O—Si bridges, wherein a part of the Si atoms may be replaced by other metal atoms), as well as organically cross-linked groups (e.g. vinyl groups, allyl groups, styrene groups, acrylate groups, methacrylate groups, norbornene groups, cross-linked epoxy groups). These materials are disclosed, for example, in WO 03/031499 A2; as mentioned above, they often have a refractive index of 1.50 or more which is a value that is very beneficial for the purposes of the invention. Due to the high variability of the inorganically and organically cross-linked hybrid polymers, however, lower refractive indices can also be set. As a result of photostructurability, the purely organic as well as the inorganic/organic hybrid materials can be structured from a bath material via grayscale lithography or stereolithography, as is known in the art. Inorganic/organic hybrid polymers are particularly beneficial to this end because they are normally produced via a hydrolytic condensation reaction of the monomeric starting compounds (usually silanes). The hydrolytically condensed condensates which are not yet photochemically cross-linked (usually designated as resins) are frequently present in a liquid or paste-like form so that it is possible to work without solvents or almost without solvents (e.g. with a content of approx. up to 1 or 2 wt. % of remaining solvent which cannot be removed easily from the condensates after production or cannot be removed at all). After photostructuring, the remaining liquid material is usually washed away, i.e. the beam deflection element is "developed". The mentioned lithographic processes can also be conducted with purely organic materials and photostructurable or photo-thermorefractive glasses.

If photostructuring, such as stereolithography, is used, additional components of the optical component may optionally be produced in this way.

When the photostructurable material can be thermally cured, a combination of photostructuring and thermal curing, e.g. a subsequent curing, can be used to obtain the finally cured element. This occurs of course preferably after developing.

Stereolithography processes frequently result in a high level of surface roughness. This can sometimes be of no relevance if, e.g. for optical reasons, a roughness exceeding $\lambda/10$ suffices. In other cases, subsequent polishing is necessary.

In general, the beam deflection elements according to the invention should normally have a surface roughness in the range of very fine (in the single digit nm range, i.e. less than 10 nm) to 100 nm and preferably of no more than 50 nm.

In particularly preferred embodiments of the invention, the beam deflection element is produced with the aid of so-called two-photon absorption or multi-photon absorption (TPA, MPA), optionally together with additional components of the optical component capable of being produced through this technique. This technique is well-known and is described in more detail e.g. in WO 03/037606 A1, namely based on the polymerization of inorganic/organic hybrid polymers (organically modified, organically polymerizable silicic acid (hetero) polycondensates or siloxanes). TPA/MPA can also be used to produce bodies from purely organic, photostructurable materials. Therein, the bodies are in general structured from a liquid "bath" material. The advantage of this technique compared to stereolithography is that also very small bodies can be structured with extreme precision and free shapes can be formed with very high surface quality. Devices and procedures suitable for this are disclosed in WO 2011/141521 A1. Surface roughness of down to approx. 1-4 nm can be achieved, while typically roughness values of 10 to 50 nm and also of 100 nm depending on the material can be achieved. With this technique, beam deflection elements can be produced separately (optionally simultaneously and in multiple copies) or directly on-site from a droplet of the source material on the optical component; at the same time, additional optical components may be produced from the same droplet, e.g. waveguides or prisms. Producing the beam deflection element directly on the desired substrate of the component is also possible with the help of other photostructuring methods, e.g. stereolithography mentioned above, however, not with the surface quality of less than 20 µm usually desired. In this manner, the beam deflection element can be mounted directly on a radiation input or output so that a material for adhesion or the like that requires height and is incorporated in the optical calculation can be omitted.

Even some glasses are photostructurable; they alter their chemical properties, e.g. their solubility, through exposure. For example, it is possible to rinse the exposed volume after photostructuring with hydrofluoric acid, an ammonium fluoride solution or mixtures thereof, i.e. this is a positive process.

TPA or MPA processes can also be applied to produce embodiments of the beam deflection element that have an inner or outer lens, as is shown below, e.g. based on basic form E (FIG. 5-1). This lens may consist, e.g. of glass, and serve as a support for the curing of the photostructurable material in the TPA/MPA process (in this case, from a separate bath).

If the used source material can be both photochemically structured and thermally cured, it is possible to design the beam deflection element as a molded body with two regions having a different primary structure (i.e. with regions that differ due to different chemical bonds which affect, e.g. the degree of cross-linking, or which differ due to restructuring or rearrangements) and/or a different secondary structure (this means the arrangement of the molecules in the molded body composite which is affected e.g. by folds or compactions), wherein the different primary and/or secondary structure scan have, for example, different refractive indices. The respective techniques are described e.g. in WO 2014/108546 A2 and WO 2014/108538 A2: the object, herein the beam deflection element, is formed to a suitable (outer) shape and is preferably subjected to thermal pre-curing (in some cases even by means of a floodlight), and then an inner structure with a different primary and/or secondary structure is produced ("inscribed") by means of laser and TPA/MPA; and finally, a final curing can additionally be conducted is desired, which is necessary if pre-curing has not been carried out. It is surprising that thermally pre-cured material can be further processed and controlled through TPA/MPA, even if it has to be assumed that the potential polymerization reaction already occurs entirely during thermal pre-curing. Nevertheless, the material changes at the locations (voxels) where laser light is radiated with such intensity that TPA/MPA is possible, in particular, this results in a different refractive index. This method is suitable for the production of those variations of the beam deflection element according to the invention having a two-dimensional face, e.g. a grid, or a volume element inscribed in the inside thereof, for example, a lens which respectively affects the beam path of the passing radiation, be it by means of reflection, splitting the beam into different wavelengths or splitting a beam with different wavelengths into different paths for each individual wavelength, or a waveguide angled by 90° and containing a photonic structure in the curvature, such as a photonic crystal, etc.

In another variation of the invention, the beam deflection element can be produced to be integrated in a solid environment. To this end, the region on the optical component to be provided with this solid material and having at least one radiation input or output element, is provided with a photostructurable liquid material that can be thermally cured, for example a droplet of this material or a coating consisting of this material, which can cover the component up to a desired height or entirely. This is then pre-cured preferably by means of flooding with light or thermally. The beam deflection element is subsequently structured in the droplet or in the pre-cured material on the radiation input or output element by means of TPA/MPA. The formation of additional optical components in this manner, for example from waveguide structures, in the droplet or in the pre-cured material, is also possible. A subsequent curing may follow in the case of a pre-curing as described in the previous section; this should follow if no pre-curing occurred.

The production of waveguides by means of TPA is well known and is also suggested in WO 2007/128021 A1 for the elements described there. Aside from the beam deflection element or parts thereof, it is also possible according to the invention to produce waveguides that may be present by TPA structuring. This may occur in the same process step. Either only the waveguide as such can be produced directly in a solid environment, as described in the previous section for the beam deflection element, wherein the surrounding material functions as a cladding, or the beam deflection element is also embedded in the solid material. In this regard, the waveguide can be formed directly adjoining the beam exit face of the beam deflection element, particularly when the beam exit face is flat; alternatively, there can be a gap between the two elements which is bridged by the light beam (the medium in the intermediate space can be air or another gaseous ambient medium or a solid material, depending on the design, for example the medium from which the deflection element and/or the waveguide was/were produced as described above).

If a waveguide is produced by photostructuring and subsequent development, as described further above, the space around the waveguide can subsequently be filled with a suitable material, for example a solid, a liquid or a gas. This material should differ from the material of the waveguide in terms of the chemical composition and/or the physical properties, particularly the refractive index, and preferably also from that of the beam deflection element. If it is a liquid, particularly a liquid is used which can be cross-linked through photochemical and/or thermal processes. This can be beneficial for achieving a higher NA/a higher refractive index difference and thus a higher waveguide efficiency.

It should be noted that waveguides or other optical elements can be produced using TPA/MPA, but alternatively also using 1-photon polymerization processes. A combination of the different methods is also possible.

The invention should be explained in further detail below based on specific examples. In doing so, the beam path is normally described based on the path of a beam or beam bundle exiting a radiation output element; however, it should be clear that the beam path may of course have the reverse direction and enter a respective radiation input element. All figures show a substrate (e.g. a photonic chip or a photonic-integrated circuit) having a surface 1 on which a radiation output (or input) element 2 is arranged. The element 2 itself can also act as a substrate; in this case, 1 and 2 are identical. As explained above, the beam bundle of this type of element usually has a beam angle of approx. 7-10°. In all cases, the beam deflection element is arranged directly on the radiation output/input element 2.

FIGS. 2-1 to 2-4 show basic forms A of a beam deflection element.

FIGS. 3-1 and 3-2 show basic forms B of a beam deflection element.

FIGS. 4-1 and 4-2 show forms C and D of a beam deflection element with two parts.

FIGS. 5-1 to 5-6 show basic forms E of a beam deflection element.

FIGS. 6-1 to 6-5 show basic forms F of a beam deflection element.

FIG. 7-1 shows another embodiment of a beam deflection element.

FIGS. 8-1 to 8-6 show other embodiments of a beam deflection element.

Figures 1, 3:
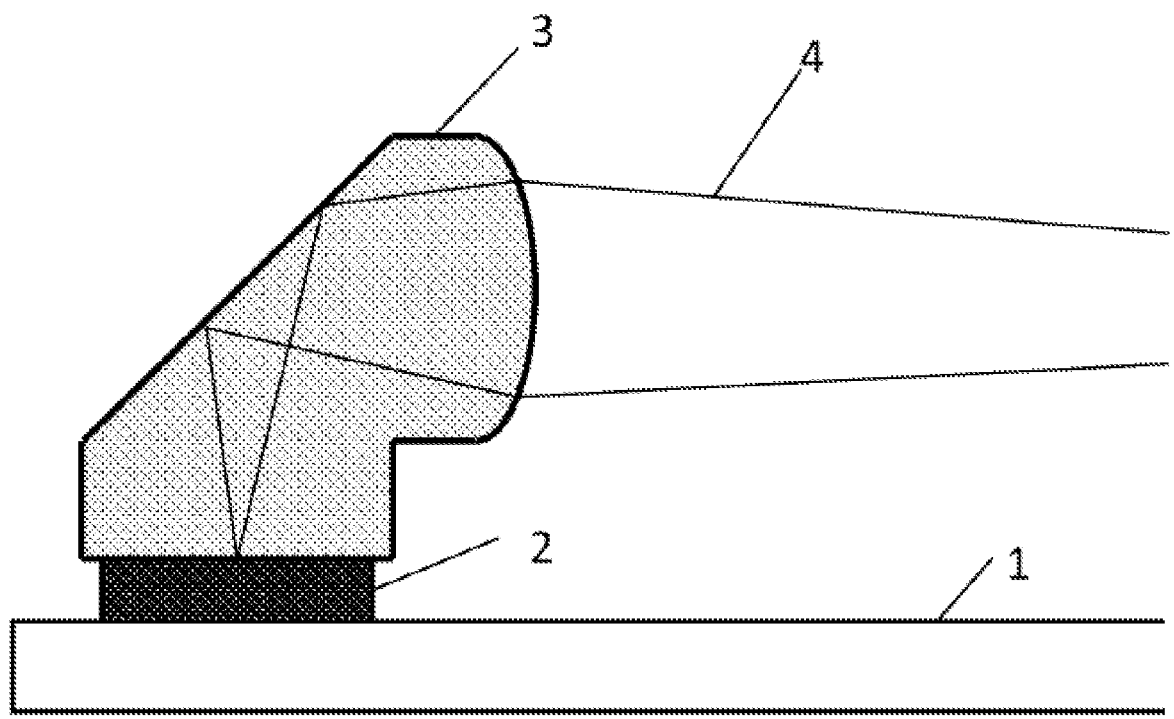
Figures 2, 3:
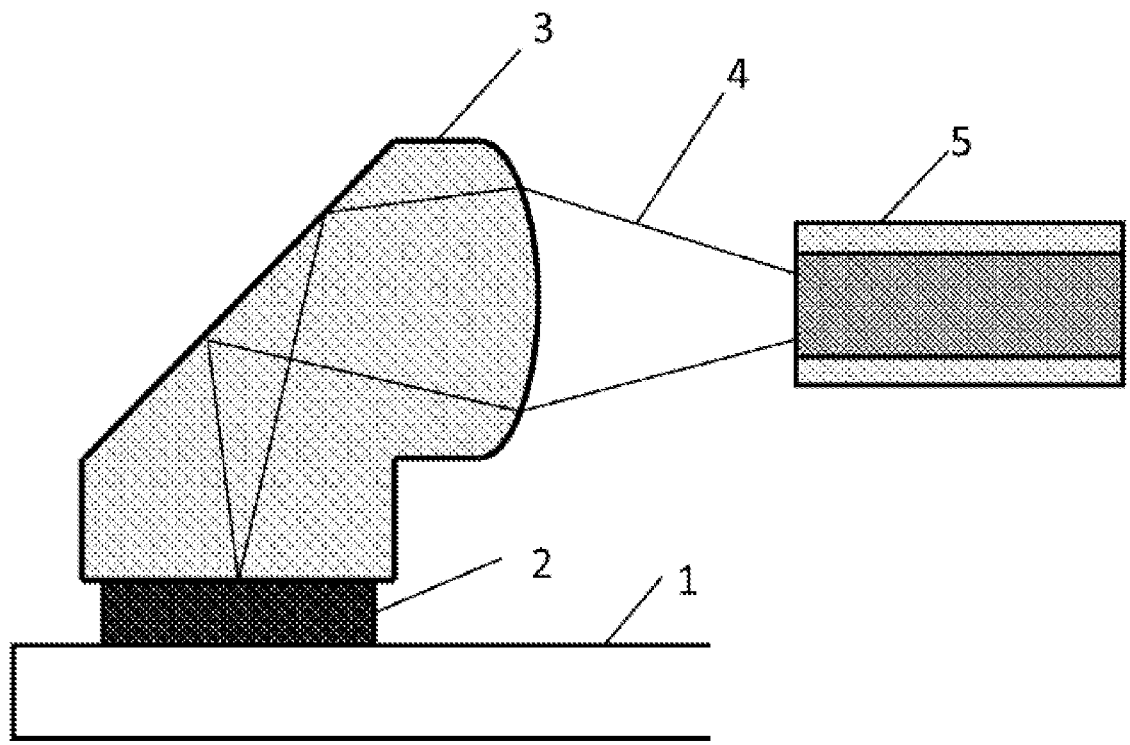
Figures 1, 4:
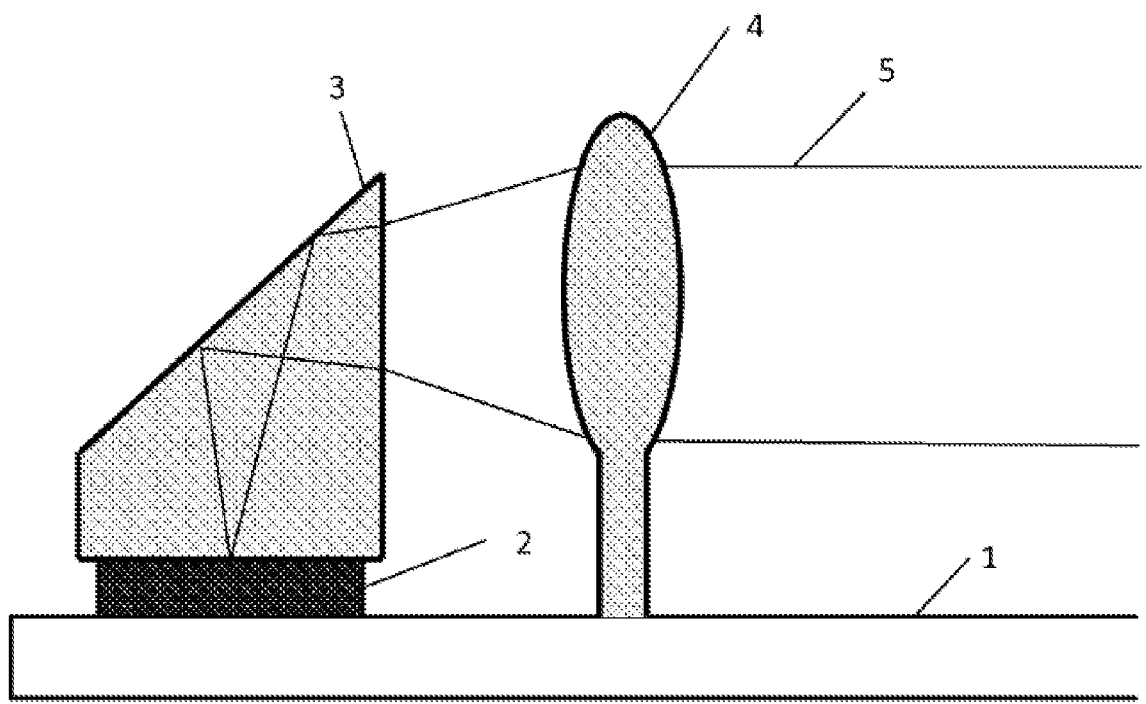
Figures 2, 4:
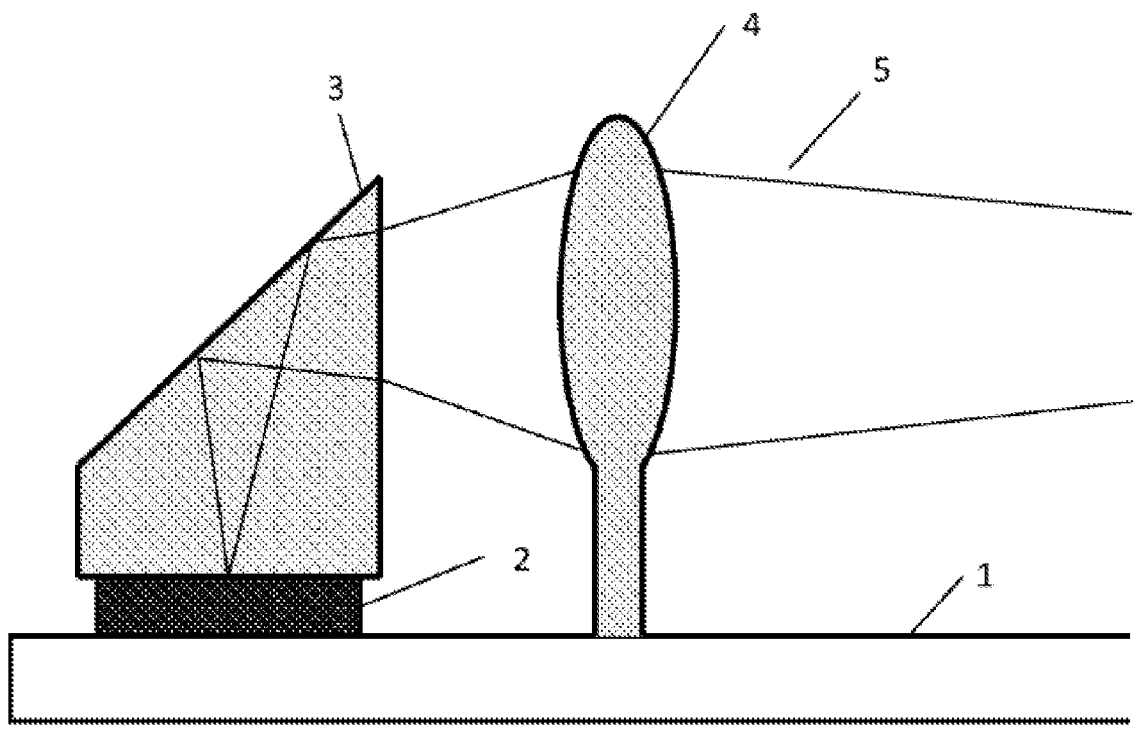

An embodiment of a micro-optical component with the basic form (form G) of a beam deflection element is shown in FIG. 1-1, which utilizes a principle of beam deflection known in the art. Beam deflection element 3 has a curved surface that acts as a focusing mirror (mirror plus lens) for the radiation exiting the radiation output element. The light beam collimated by this mirror exits element 3 through an additional face of the deflection element, passes the face plane vertically and therefore does not affect the beam shape, and enters free space. In the prior art, however, such beam deflection elements are also embedded in a solid material having a refractive index differing from that of the material used for the beam deflection element. The beam path does not change because of this. The depicted beam deflection element has a material-saving undercut below the beam exit face which could not be achieved with the previous manufacturing methods for these elements. The form of the beam deflection element is therefore new. However, the undercut is of no significance for the beam path.

Figure 2:
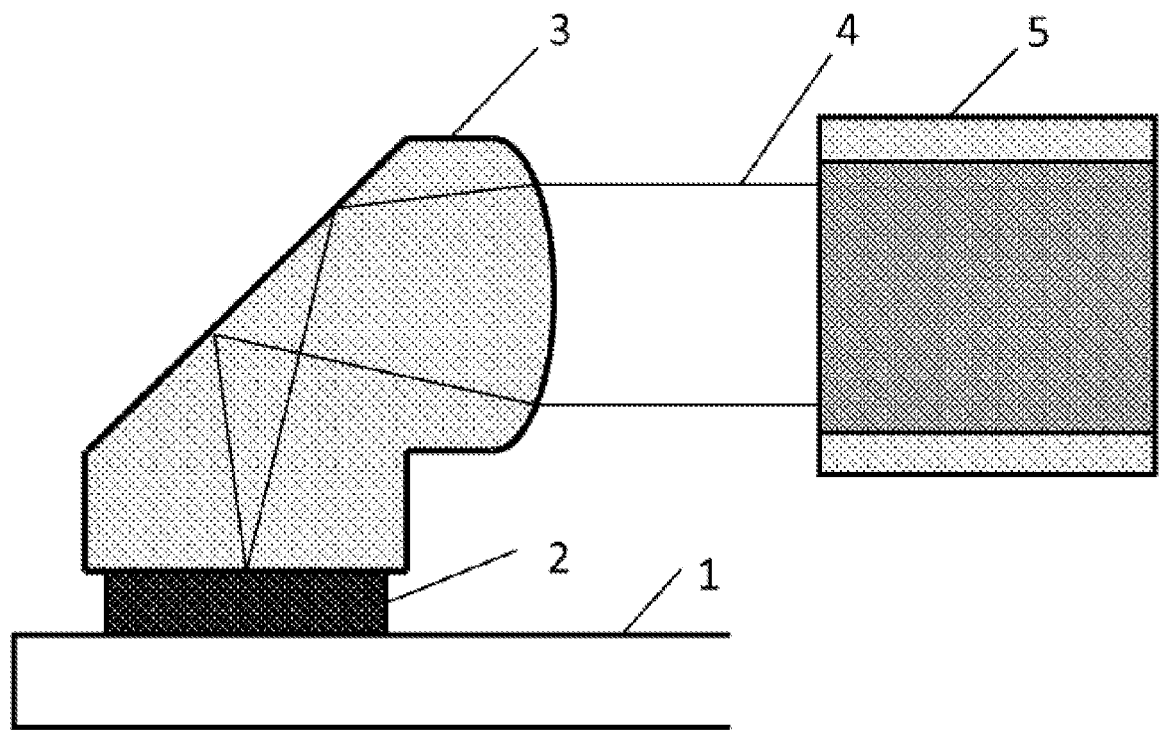
FIGS. 1-1 to 1-3 show a beam deflection element.
Figures 2, 3:
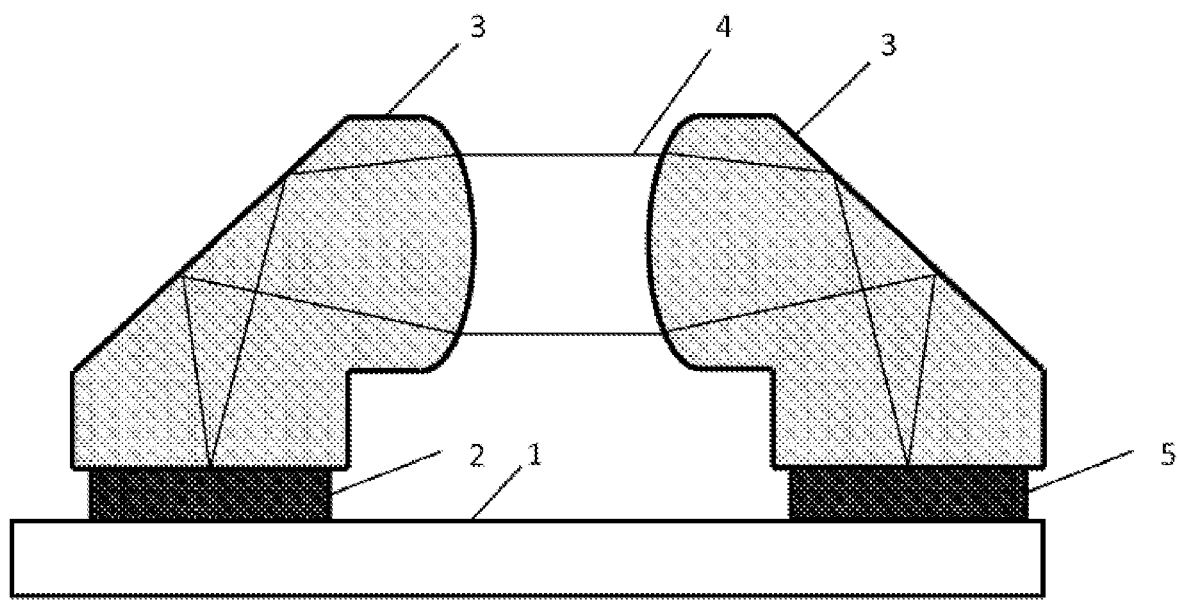

FIGS. 1-2 and 1-3 illustrate the technical limits of this beam deflection element: as previously explained, the use of a single face for the deflection and collimation or other shaping of the beam is disadvantageous in that the beam height and the diameter of the beam cannot be adjusted independently; for a desired beam diameter, the height of the beam is automatically fixed. FIG. 1-2 shows an embodiment with which the desired small target diameter is achieved but not the target height of the collimated beam, since the distance between the curved face and the beam source must remain small to form a narrow beam. FIG. 1-3 shows the opposite case; while the target height is achieved, the target diameter is not. Due to the greater distance between the curved surface and the beam source, the produced beam is too wide.

This disadvantage is eliminated with the beam deflection elements according to the invention which are described in further detail with reference to individual embodiments. The descriptions for these embodiments illustrate that different features of the various embodiments can also be combined with each other; as a matter of course, these combinations should likewise be comprised by the invention.

A basic form A of such a beam deflection element is illustratively shown in FIG. 2-1. In this basic form the element has two outer faces affecting the beam shape. Of course, the geometry to be chosen in a specific case also depends on the refractive index of the material of the beam deflection element, and on the refractive index difference to the surrounding space. The beam exiting beam source 2 strikes an optionally mirrored (e.g. with metal), flat inclined (outer) face, on which it is reflected. After reflection, beam expansion necessarily continues within the element. The beam moves in the direction of a second (outer) face which affects the beam and is curved in a lenticular manner. There, the beam is deflected and collimated. It exits the deflection element as a parallel beam 4 and enters the free space (e.g. air, vacuum) in this embodiment, for example in order to strike an element with an optical input at a certain distance, such as a light conductor, a sensor, a detector or a grid. Embedding the beam deflection element in a liquid or solid medium having a refractive index which deviates from that of the material of the deflection element would alternatively be possible. It is immediately clear that a beam having a freely selectable width, even a large width, can be produced with this design, even when the distance between the beam source and the reflective surface is short and the design is correspondingly short and compact.

FIG. 2-2 shows the continued path of the collimated light beam, in this case an optical fiber optical waveguide. It may consist of glass or another transparent material and can be surrounded by a cladding layer. These fibers can be produced, e.g. through structuring with TPA/MPA within a liquid or pre-cured material, as described above. The fiber optical waveguide can be part of the optical component on which deflection element 3 is arranged, and can e.g. be anchored on surface 1 thereof, though this is not necessary (it can connect two of these elements or guide the light to another object).

FIG. 2-3 shows an alternative to this. Here, the collimated light beam 4 exiting the deflection element 3 is guided into a radiation input element 5 which is arranged on the same optical element as the radiation output element 2, namely via a second deflection element 3 which is formed and arranged mirror-inverted.

Figures 2, 3, 4:
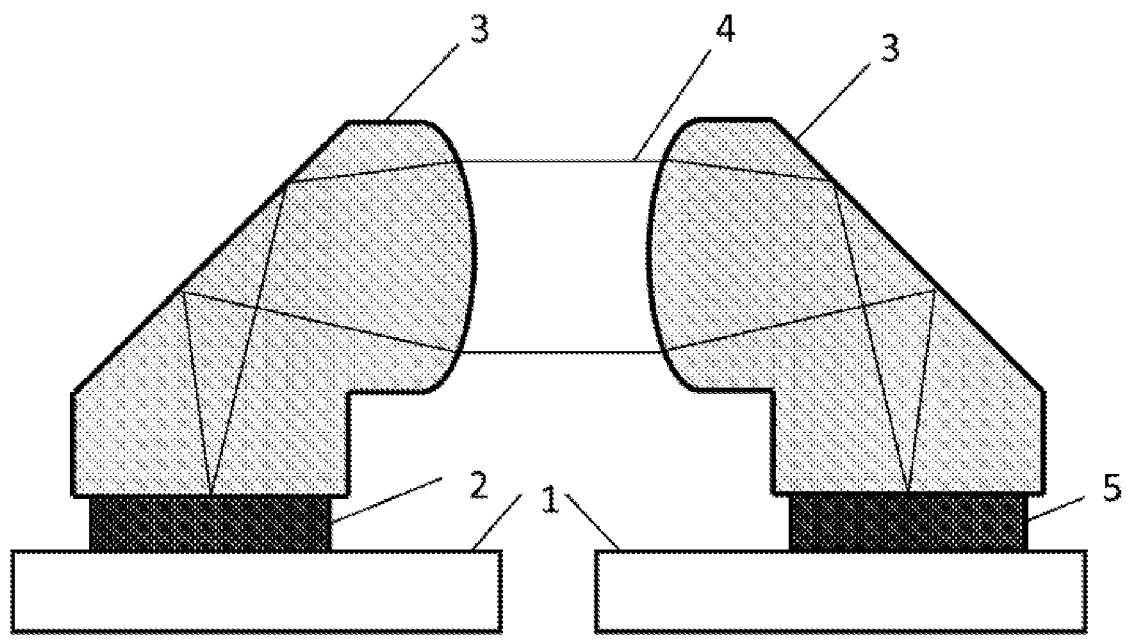

In a variation to this which is shown in FIG. 2-4, the light beam is guided by free space propagation to a second optical element having a second substrate surface 1 to there enter a radiation input element 5 located on substrate surface 1 of the second optical element, for example a detector or a grid for light coupling, via deflection element 3 which is formed and arranged mirror-inverted.

If both faces affecting the path of the radiation passing through the beam deflection element are outer faces of this element, as shown above for basic form A, beam 4 exiting deflection element 3 does not necessarily have to be parallel. Alternatively, lens can be designed such that it can be focused on any object, as shown with reference to basic form B of FIG. 3-1. It is immediately clear that the geometry of the deflection element and the lens shape can be selected in such a way that instead an expanding beam is produced.

A variation of basic form B is shown in FIG. 3-2, in which the beam is focused on the input of an optical waveguide fiber. Again, suitable fibers are glass fibers of fibers produced, e.g. through structuring with TPA/MPA as specified for FIG. 2-2. This embodiment is particularly suitable for single-mode fibers.

FIG. 4-1 illustrates those designs of the invention in which the beam deflection element is designed with two or more parts, wherein a first part is arranged directly on the radiation input element 2 or on at least one thereof and usually slightly projects over it. In form C shown in this figure, the first part 3 of beam deflection element has a reflective surface as described for forms A and B (FIGS. 2 and 3). However, the light beam is not collimated or focused when exiting this part of the deflection element. It exits from a face where it remains unchanged or slightly diffracted depending on the inclination (vertical to this surface or at an angle different from 90°). The required collimation then occurs at a separate lens 4 which can be arranged for example on a shaft directly on the substrate (though this is not mandatory). The beam passes through this lens and is collimated thereby in a desired form (parallelized, as shown in FIG. 4, or focused, as shown in FIG. 4-2 with reference to a design termed "form D"; or instead the beam can also be expanded).

Forms C and D are again basic forms which can be diversely modified. For example, a multitude of lenses can be used in place of one lens. Alternatively, or in addition, it is also possible to design the exit face of first part 3 of the deflection element in the form of a lens, concavely or in any other suitable manner.

The exiting beam can propagate into the open environment or enter a surrounding liquid or solid medium, as described above for forms A and B.

Figures 1, 5:
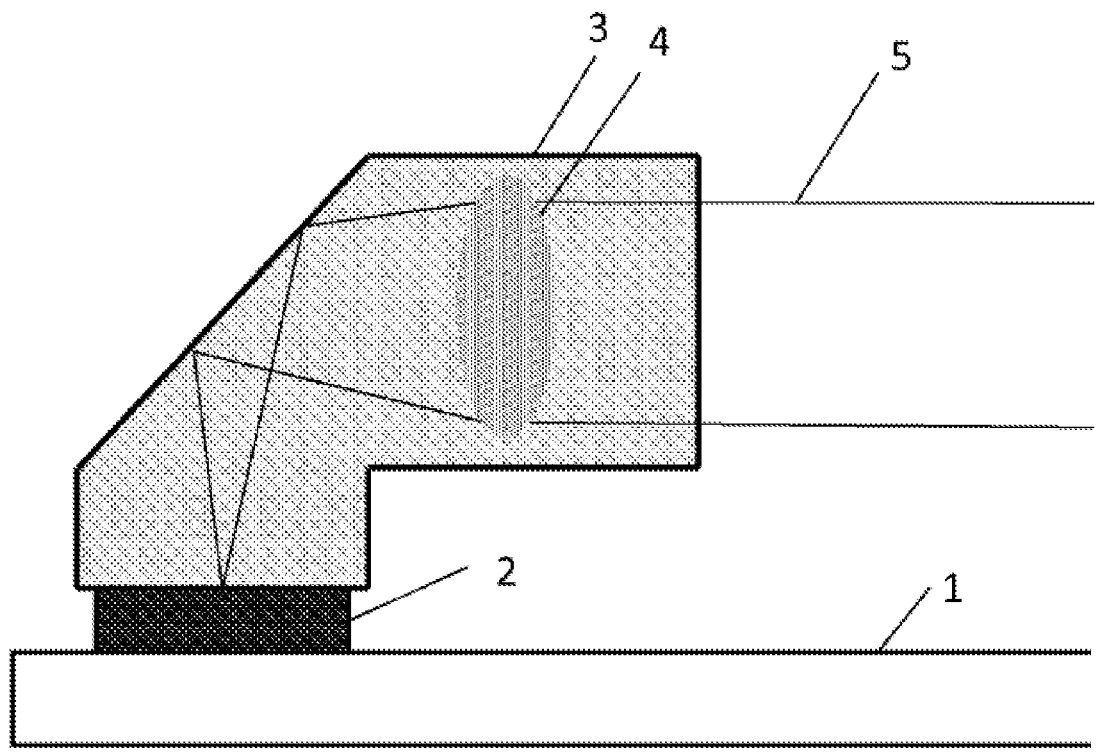
Figures 2, 5:
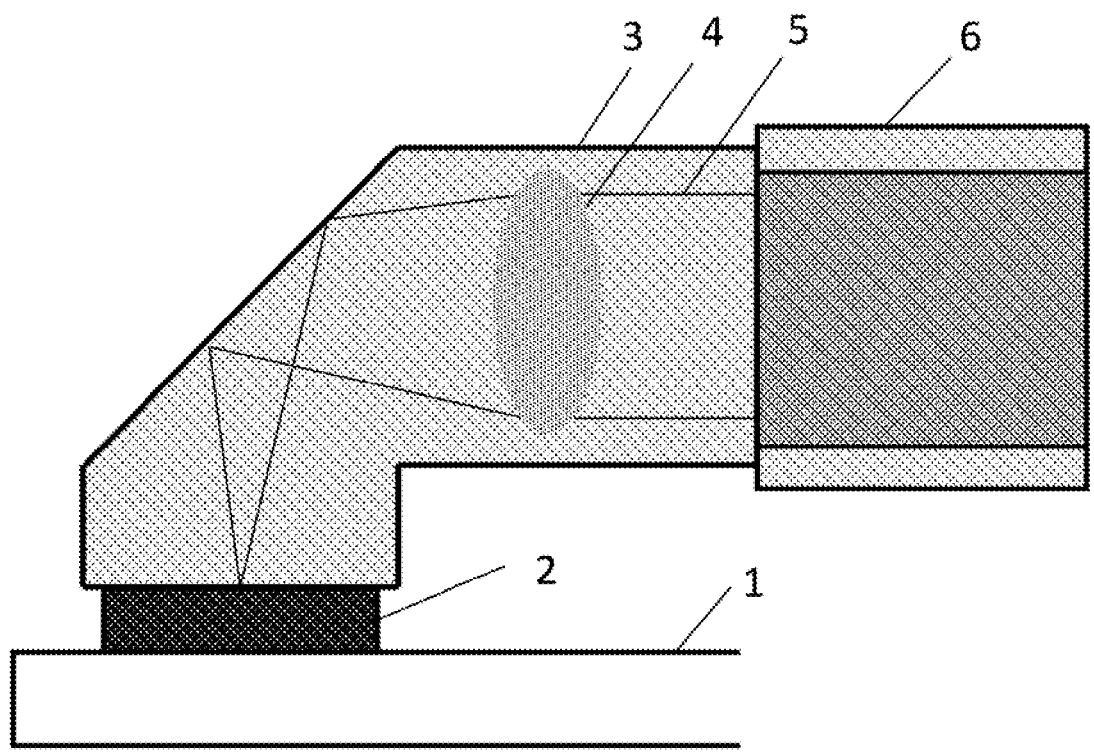
Figures 3, 5:
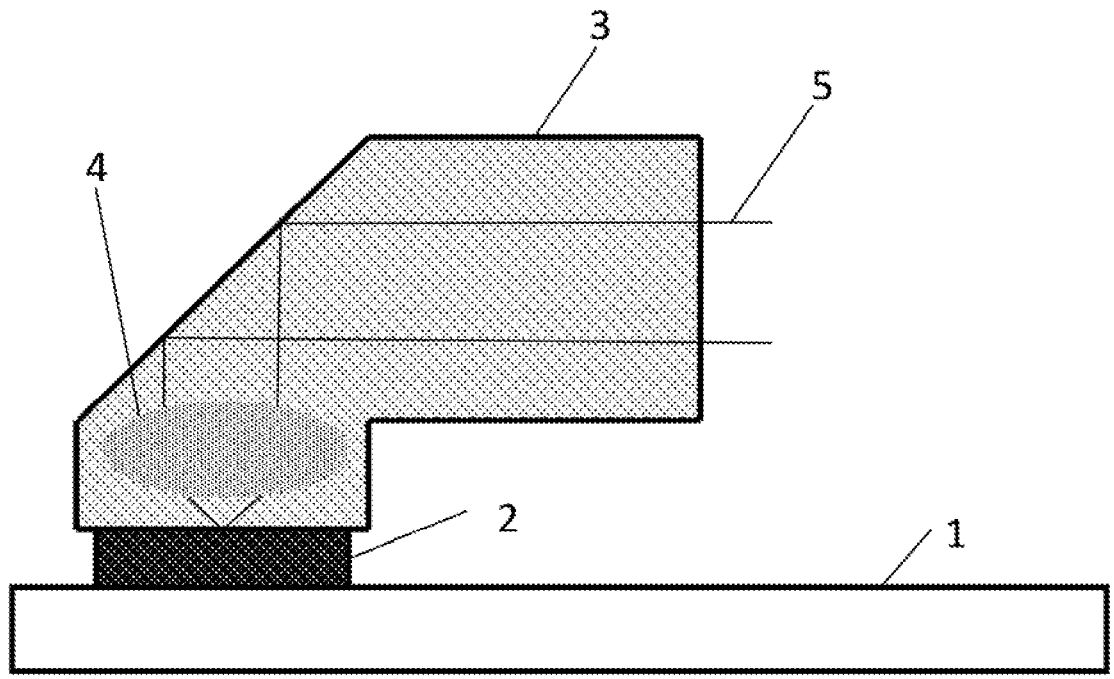
Figures 4, 5:
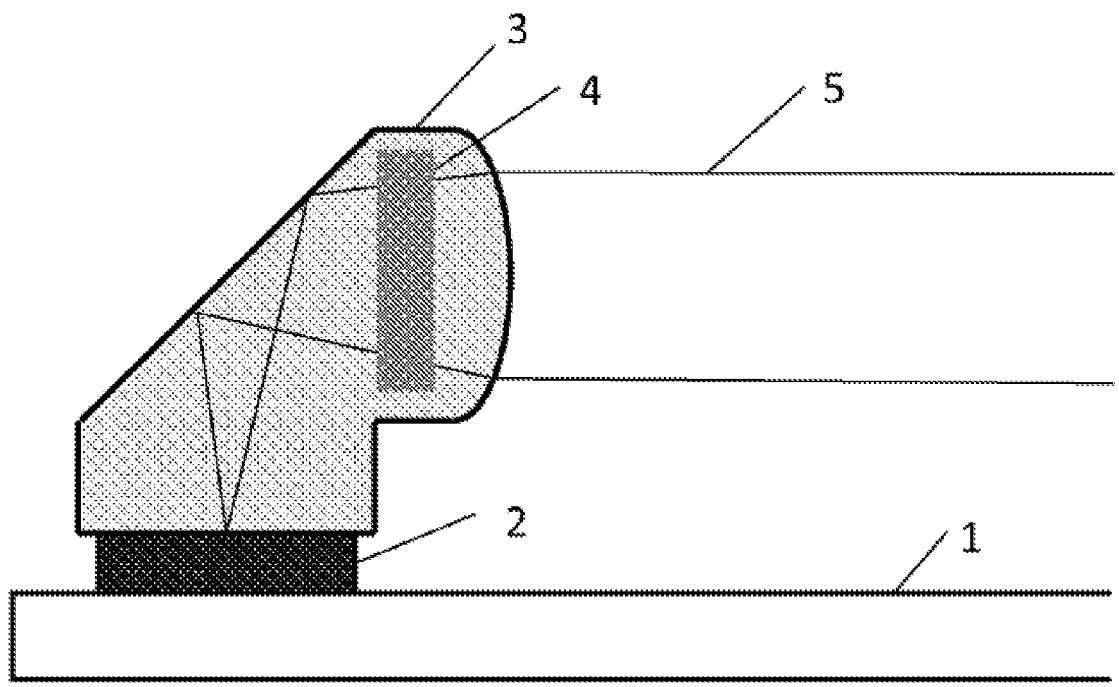
Figure 5:
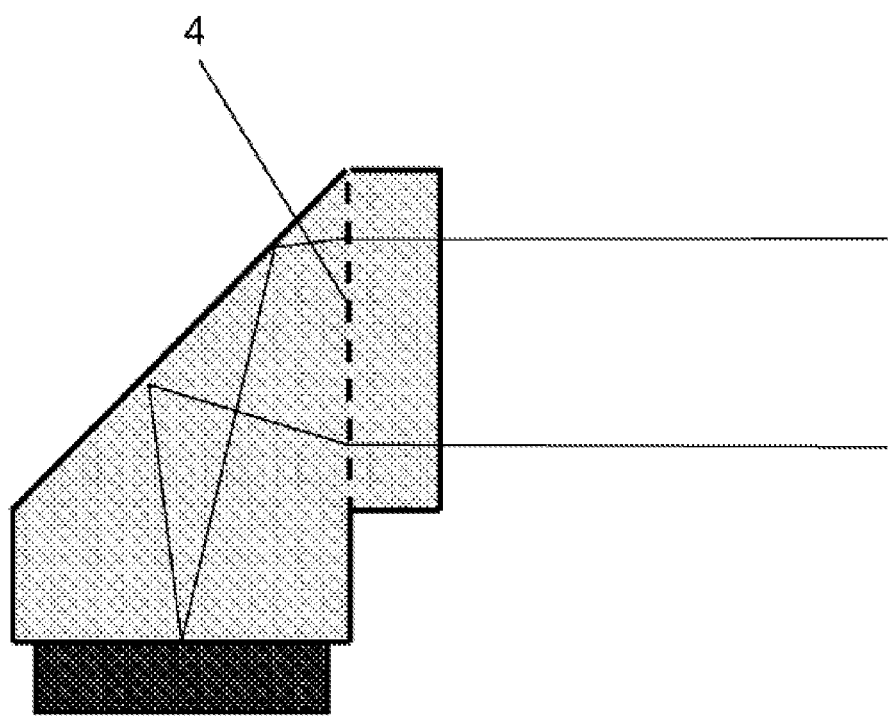

FIG. 5-1 shows an embodiment (basic form E) in which the lens surface 4 is not an outer face of the beam deflection element 3 or in which a separate lens is arranged in the beam path of the beam coming from a first part of the deflection element, but in which a lens comprising the faces affecting the beam path is located inside the element. This can be achieved by using two optically unequally dense materials for the lens and for the material of the deflection element surrounding the lens. This variation can be produced, e.g. by encapsulating a glass lens in a liquid or pasty organically polymerizable material, which is then polymerized in a suitable form, wherein the formed polymer has a different refractive index than the glass lens. A more elegant manufacturing route is carried out by "inscribing" a lens by means of TPA/MPA. To this end, the beam deflection element is pre-structured in its exterior form, e.g. through polymerization (through light or heat) in a mold, through a stereolithography process or a printing process. A two-photon or multi-photon polymerization is then carried out within the pre-cured material using a laser, wherein the laser light causes an additional TPA/MPA and thereby curing (a change of the primary or secondary structure as described above). The refractive index difference with respect to the material not exposed to the laser light achieved thereby can be sufficient to cause a deflection of the light beam.

It should be clear that the lens does not necessarily have to be located completely inside the deflection element; instead, one of its surfaces can form that (outer) face of the beam deflection element through which the light radiation passes. In that case, the beam deflection element may also be assembled from the two components consisting of a different material, by e.g. fitting the lens in a concave recess of the remaining beam deflection element and e.g. adhering or mounting it there in another manner.

In the variation in accordance with FIG. 5-2, the exit face of deflection element 3 is directly connected to an optical waveguide fiber ("butt coupling"). This optical fiber can be a glass fiber as well, in particularly a multi-mode fiber, or a waveguide structured through TPA/MPA.

Based on FIG. 5-3, it is easy to see that the beam deflection does not necessarily have to proceed in the order "first reflection, then beam formation". In this figure, a modification of form E is shown in which the light beam passes through the lens first and only then passes the reflection face.

The purpose of FIG. 5-4 is to demonstrate that not just lenses can be considered as an integral beam deflection element. An element 4 is schematically integrated into the deflection element according to the invention which should stand for any element causing a volume structuring, for example a "classical" lens, a sequence of multiple lenses, a diffractive optical element, a thin hologram, a volume hologram or a metamaterial. At the same time, this can be a device for combining a beam (fan-in element) or a device for separating a beam (fan-out element).

In the form shown, the light beam exits the beam deflection element through a curved face; depending on the conditions to which the beam has been subjected previously inside of the deflection element, this surface can also be chosen as flat.

The specific case of an integrated diffractive optical element 4 (DOE) in this variation is illustrated in FIG. 5-5.

Figures 5, 6:
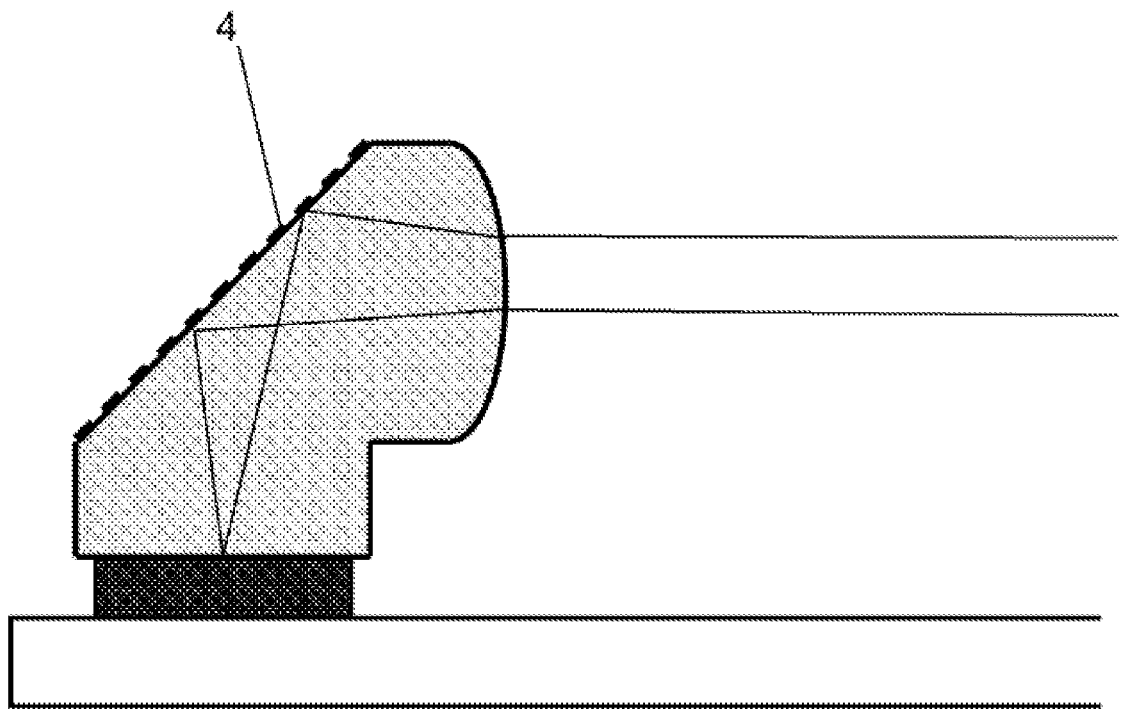
Figures 1, 6:
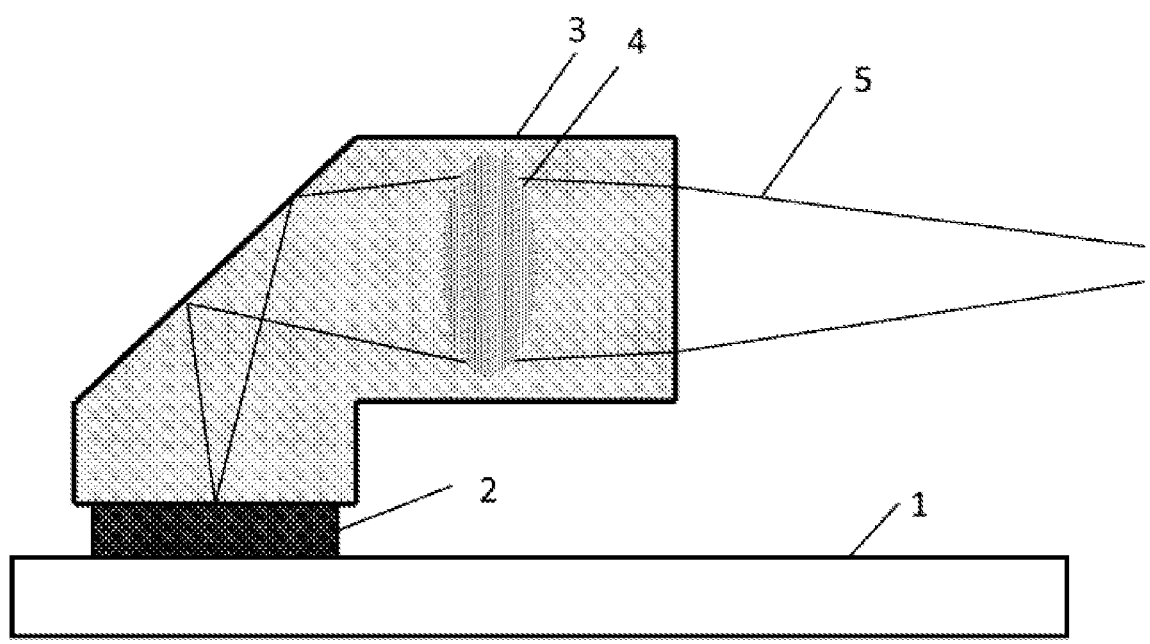
Figures 2, 6:
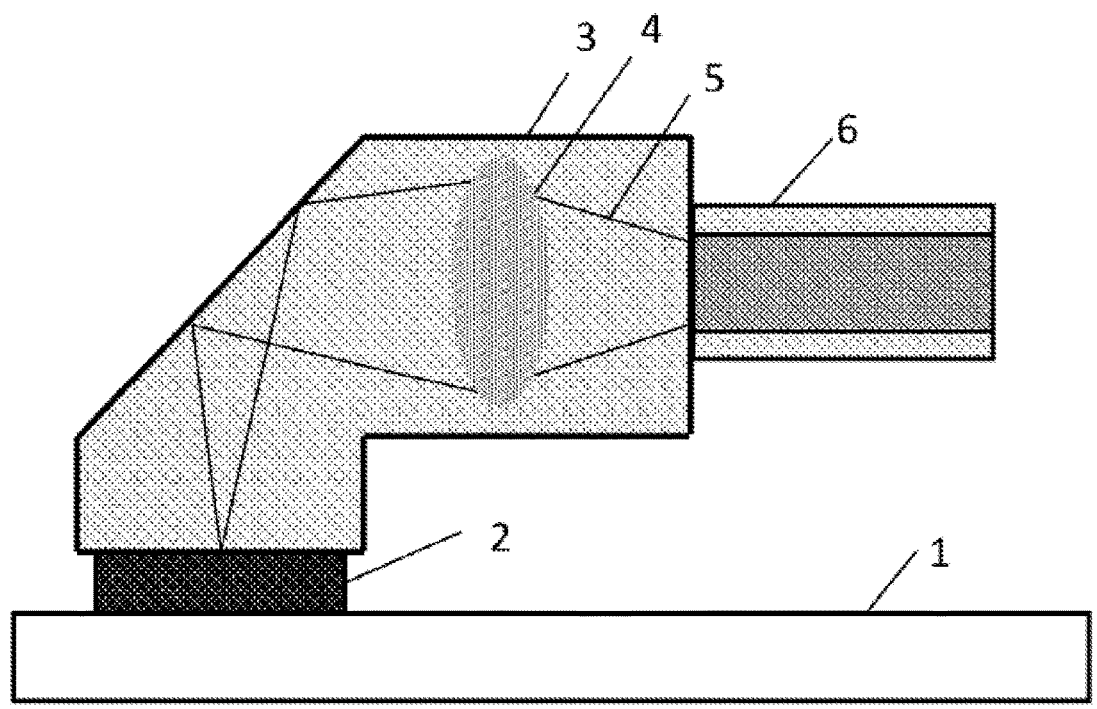
Figures 3, 6:
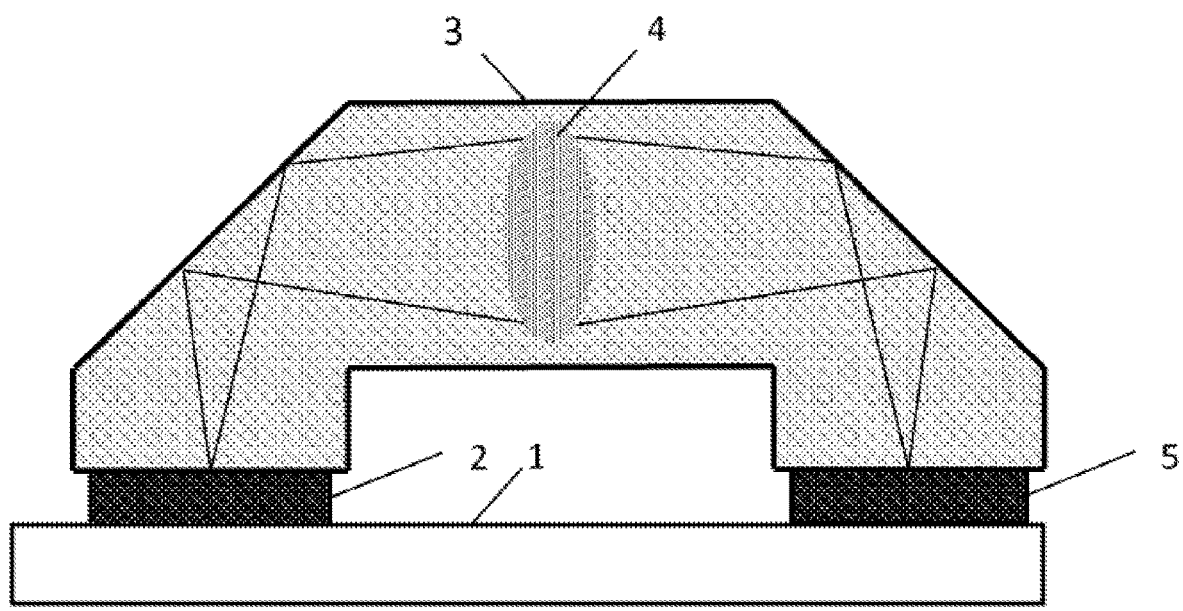
Figures 4, 6:
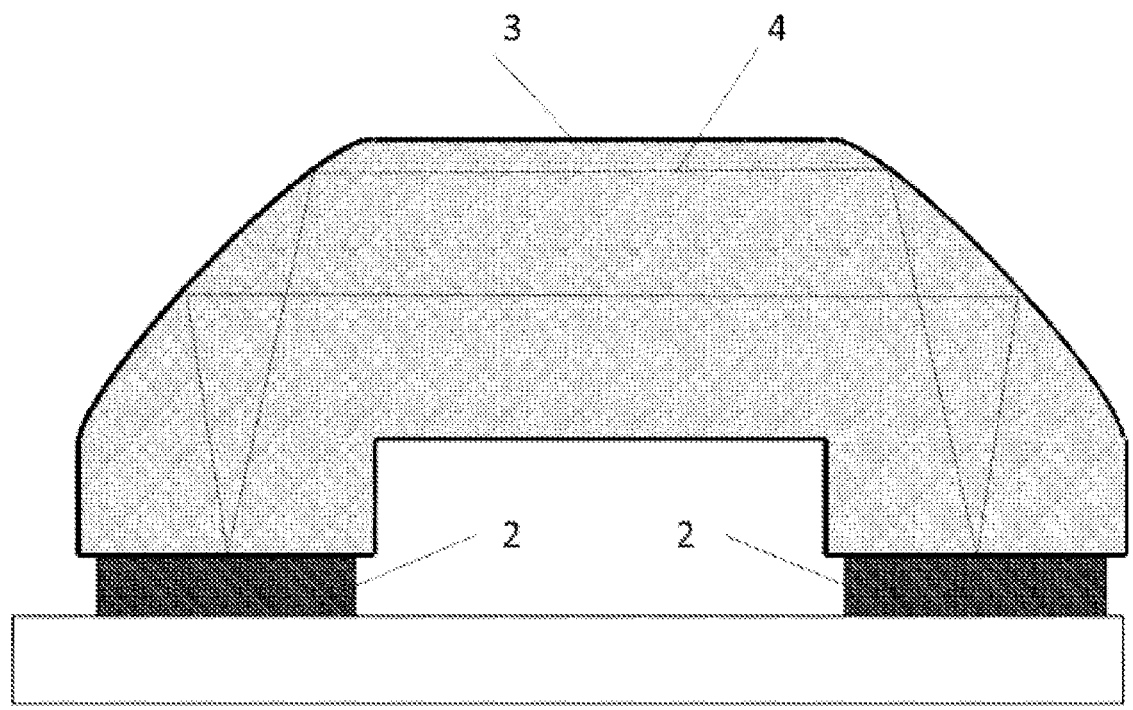
Figures 5, 6:
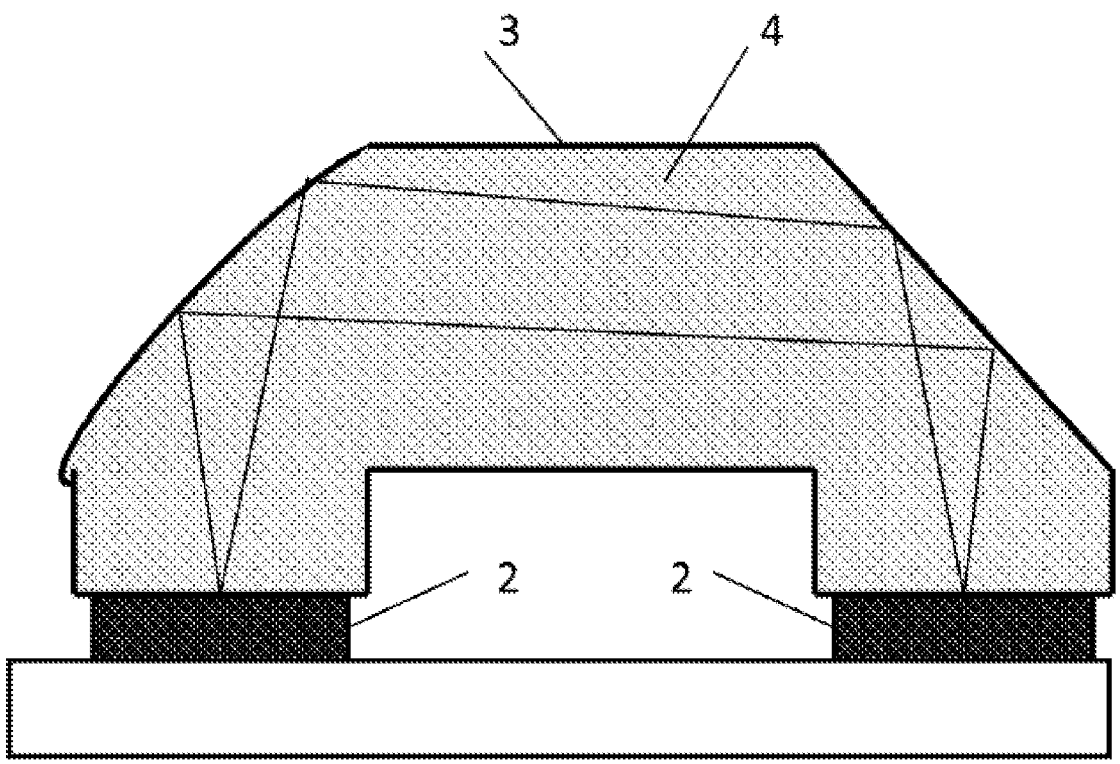

The variation in FIG. 5-6 shows another specific case. Here, the diffractive optical element (DOE) is integrated into the reflective surface of the beam deflection element. Thus, the beam striking the reflective surface is not only reflected, but simultaneously its phase and/or its amplitude is modulated, whereby interference and/or intensity patterns occur within the beam geometry.

In both cases, the DOE can be for example a phase plate in the form of a Fresnel zone plate for focusing.

Basic form F shown in FIG. 6-1 shows a variation of form E with a lens, wherein the lens is formed in such a way that not a parallel beam but rather a converging light beam exits the deflection element. It can be directed to any optical element or object such as the input of an optical waveguide fiber (shown in FIG. 6-2) or to a separate lens being an integral part of the light deflection element, as explained for forms C and D.

On the basis of basic form F, FIG. 6-3 shows a variation that is designated as a "combined element" in the general part of the description, i.e. a beam deflection element in which the necessary functions and geometries of "single basic element E" occur twice, in this case as mirror images (in this case, both outer faces of the lens respectively act as an element changing the beam divergence and/or the beam shape, wherein the one should be assigned to the first part and the other to the second part of the combined element). This element can be used to guide radiation from a radiation output element 2 (a laser or the like) arranged on surface 1 of the substrate to a radiation input element 5 (a detector or the like) arranged on the same surface, wherein the lens (or alternatively a lens sequence or the like) can be used to change the beam shape, direction of coupling-in and coupling-out direction, and the numerical aperture along the path from the light source to the detector. This beam deflection element can of course transport light from a radiation output element on the surface of a first substrate to a radiation input element on the surface of a second substrate in the same way.

In a specific variation of this embodiment, the reflection surface of the element can be simultaneously curved such that the light beam is collimated and is guided parallel to the opposite curved reflection surface. A lens is not required in this case. This variation (shown in FIG. 6-4) can be described as a "combined element" of basic form G known from the prior art, wherein the further development of the present invention to the combined element does not have the technical disadvantage of the coupled deflection and focusing functions inherent to this basic form, as the light beam does not leave the element on its path from the radiation output element to the radiation input element and thus the target height as well as the target diameter of the beam can be freely selected within the geometrical frame of the deflection element. This variation is also formally comprised by the invention because the deflection element has a first face affecting the radiation, which causes at least a part of the incident radiation to be deflected, and a second face affecting the radiation which causes a change of the beam divergence and/or the beam shape. However, this variation (i.e. a deflection element with only two faces affecting the path of the radiation passing through the element, which are two external, curved reflection faces facing each other) is less preferred than all other variations according to the invention.

The variation shown in FIG. 6-4 does not necessarily have to be symmetrically designed, which also applies for all "combined" beam deflection elements of the invention. If the radiation of the radiation output element first strikes for example a reflection surface which is curved such that a (e.g. converging) light beam is formed and which has an inclined focus with respect to the substrate surface, this light beam can be captured again on the opposite side by a suitably inclined mirror face and guided into the radiation input element—see FIG. 6-5. In this embodiment, the emitter can have, e.g. a different beam divergence than accepted by the detector. If, for example, the emitter radiates a ±10° cone and the detector only accepts vertical light with ±1°, the beam bundle on the second mirror must be very narrow to couple all the light into the detector. An asymmetrical beam path requires asymmetrical elements. The beam shape can be adapted analogously. This variation can be for example be used with a beam deflection of a beam from an edge-emitting laser having a square exit facet, as a radiation output element, to a detector with a round entrance facet.

Figures 1, 7:
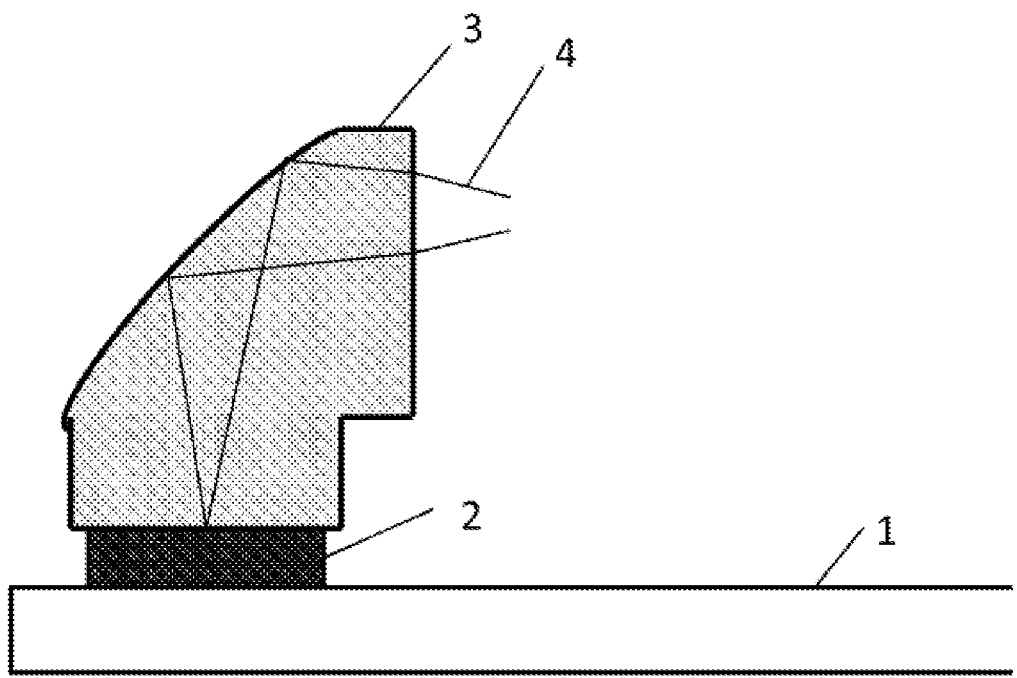

An embodiment of a beam deflection element having a non-curved exit face is shown in FIG. 7-1. Here, the refractive index difference between the material of the deflection element and that of the exterior surroundings in combination with the angle with which the beam strikes these surfaces, causes an additional deflection, namely a stronger convergence of the beam bundle compared to its form inside the deflection element.

In specific embodiments of the invention, the beam deflection element contains additional optically effective elements. One example is a so-called "multiplexer" which separates the optical paths of the light beam for different wavelengths. This element can be a grid, a DOE, a hologram, a photonic crystal or a dichroic mirror. In some instances, this multiplexer can be "inscribed" directly into the bulk of the beam deflection element by means of TPA/MPA. Otherwise, it can be embedded into the still not fully cured material of the beam deflection element as a prefabricated element, as described above, e.g. for the lenses of variation E, FIG. 6-1, 6-3.

Figures 1, 8:
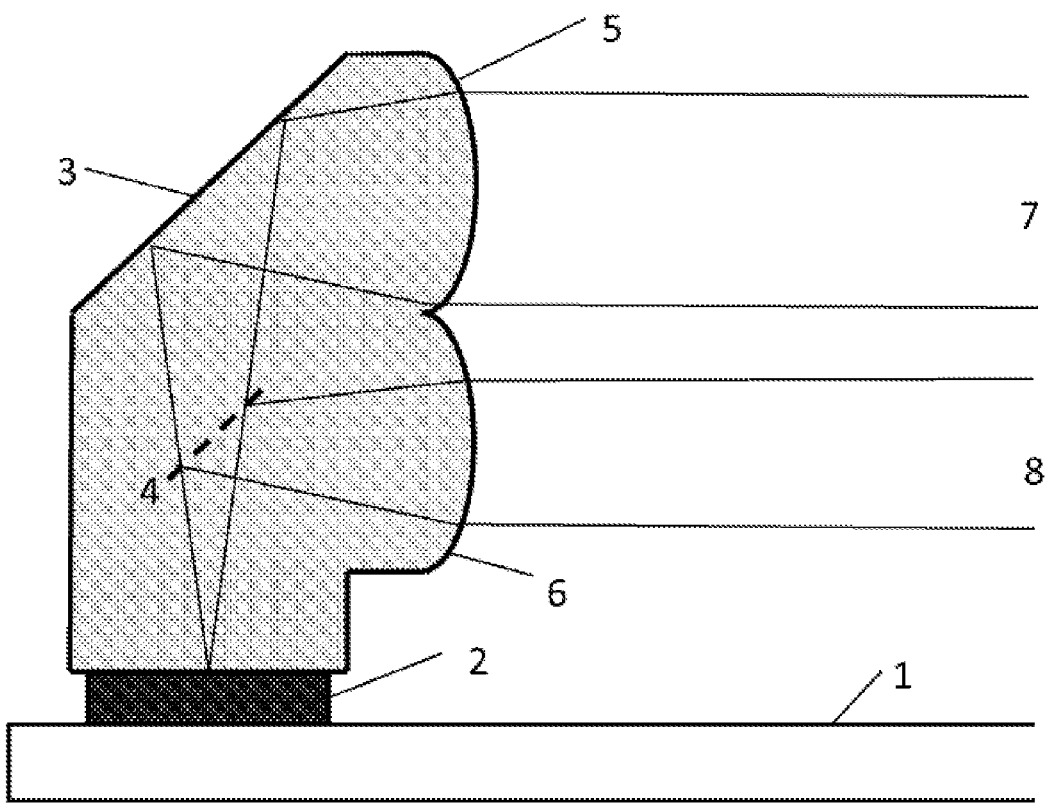
Figures 2, 8:
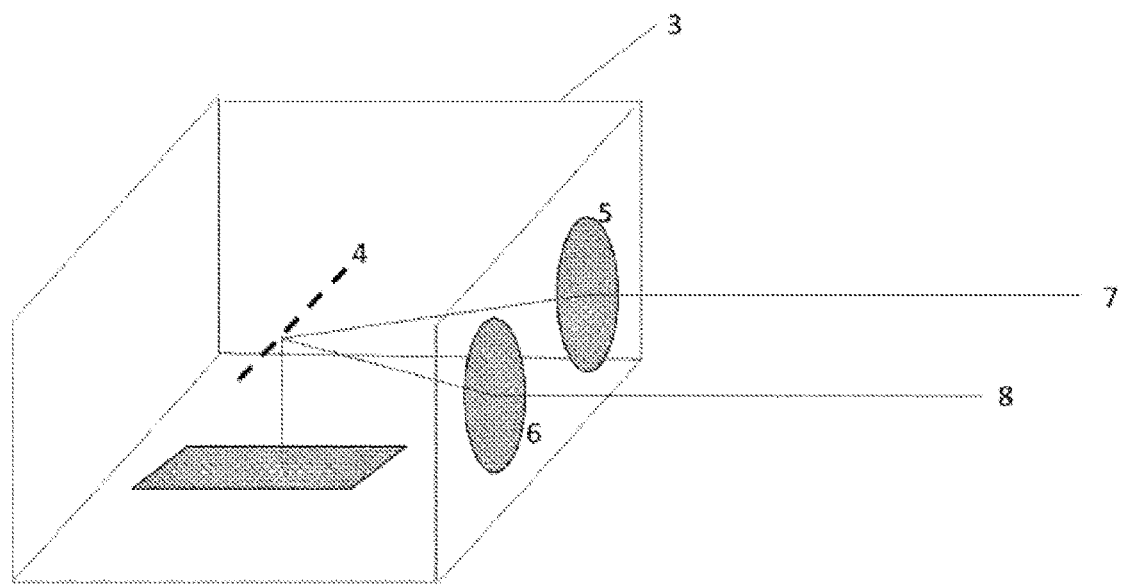
Figures 3, 8:
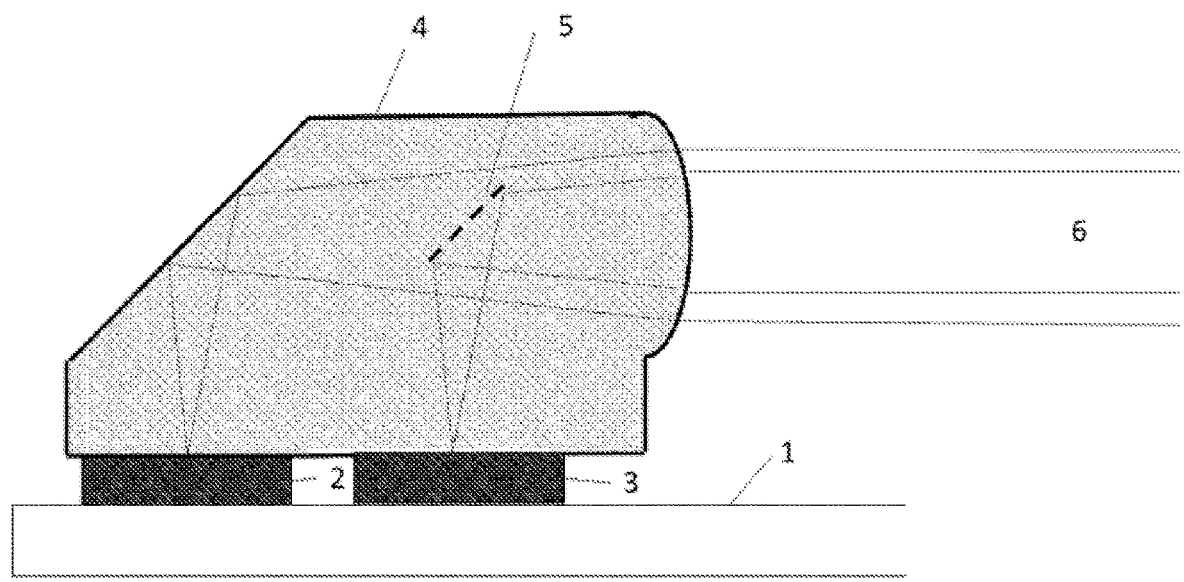
Figures 4, 8:
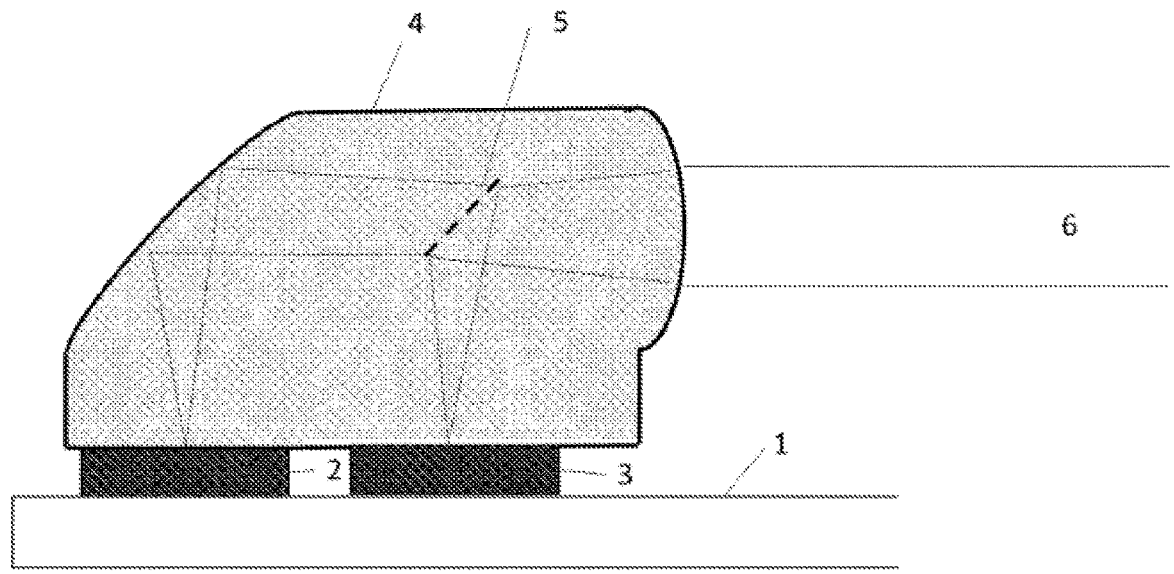
Figures 5, 8:
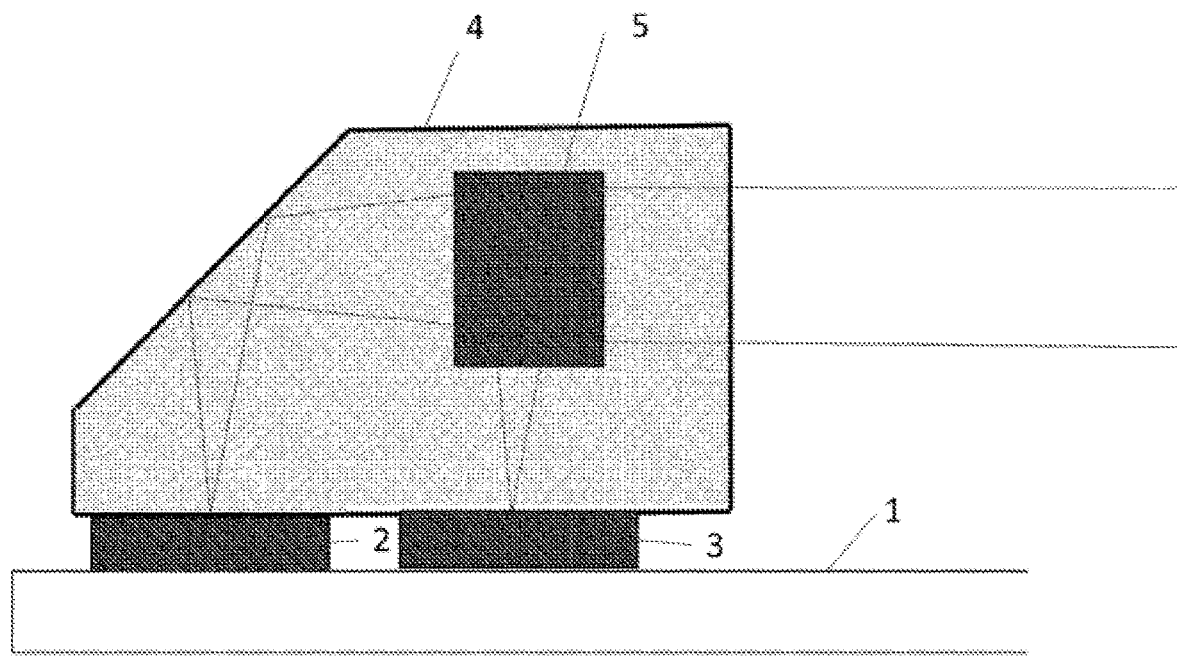
Figures 6, 8:
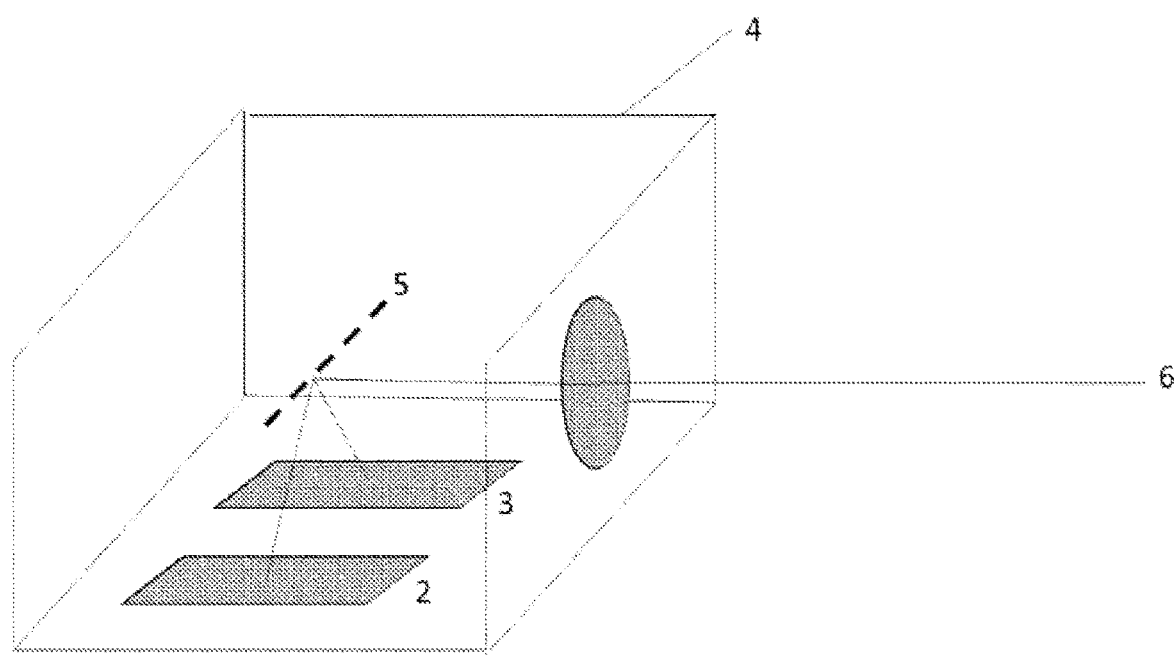

A potential variation of a deflection element containing a multiplexer is shown in FIG. 8-1. A multiplexer 4 separates the beam into two vertical components 7, 8 with differing wavelengths, which exit the deflection element through lenticular faces 5 and 7. This form requires an extremely high positioning accuracy.

Another variation is shown in FIG. 8-2 with a multiplexer 4 that separates the beam into two horizontal components 7, 8, which exit the deflection element through corresponding lenses 5, 6.

With these variations, a multitude of potential beam shapes can be achieved. Thus, for example, the paths of light of two or more different wavelengths entering the deflection element from two or more radiation output elements arranged beneath a single beam deflection element, can be separated by an element inscribed into the bulk. As such, parallel, focusing or diverging light beams can be formed that are composed of, e.g. light of differing wavelengths, wherein different parts of the beam—viewed in the cross-section—contain light of different wavelengths in a different manner. Thus, a beam bundle, the core of which forms a common light path for the light leaving both radiation output elements 2 and 3, can be formed by a flat grid or other flat element 5, as schematically shown in FIG. 8-3, wherein both radiation output elements emit light of different wavelengths. At the same time, the deflection element is formed in such a way that the light of wavelength 1 exiting 2 is reflected on a mirror surface such that it forms a wider parallel beam after exiting through the lenticular interface of the deflection element than the light of wavelength 2 emitted from 3, which is reflected on element 5. In this regard, element 5 is formed in such a manner that the light can pass through wavelength 1.

If element 5 has a wavelength-dependent refractive power (dispersion), this dispersion can be chosen such that both paths are identical in position, direction, and diameter. As shown in FIG. 8-4, the collimated beam 6 in this case consists of the same mixture of both wavelengths emitted from 2 and 3 at all positions of its diameter.

Instead of a planar element, it is also possible to provide a complex volume-structured element in the deflection element, such as a photonic crystal, a hologram or a metamaterial. The beam pattern which can be achieved thereby is comparable to that of the planar element, see FIG. 8-5, wherein cuboid 5 symbolizes the volume element.

Of course, both radiation output elements do not have to be arranged in succession with respect to the radiation path, as shown in the examples in FIGS. 8-4 and 8-5, but rather they can also be arranged side by side. A respective example is shown in FIG. 8-6.

Figure 9:
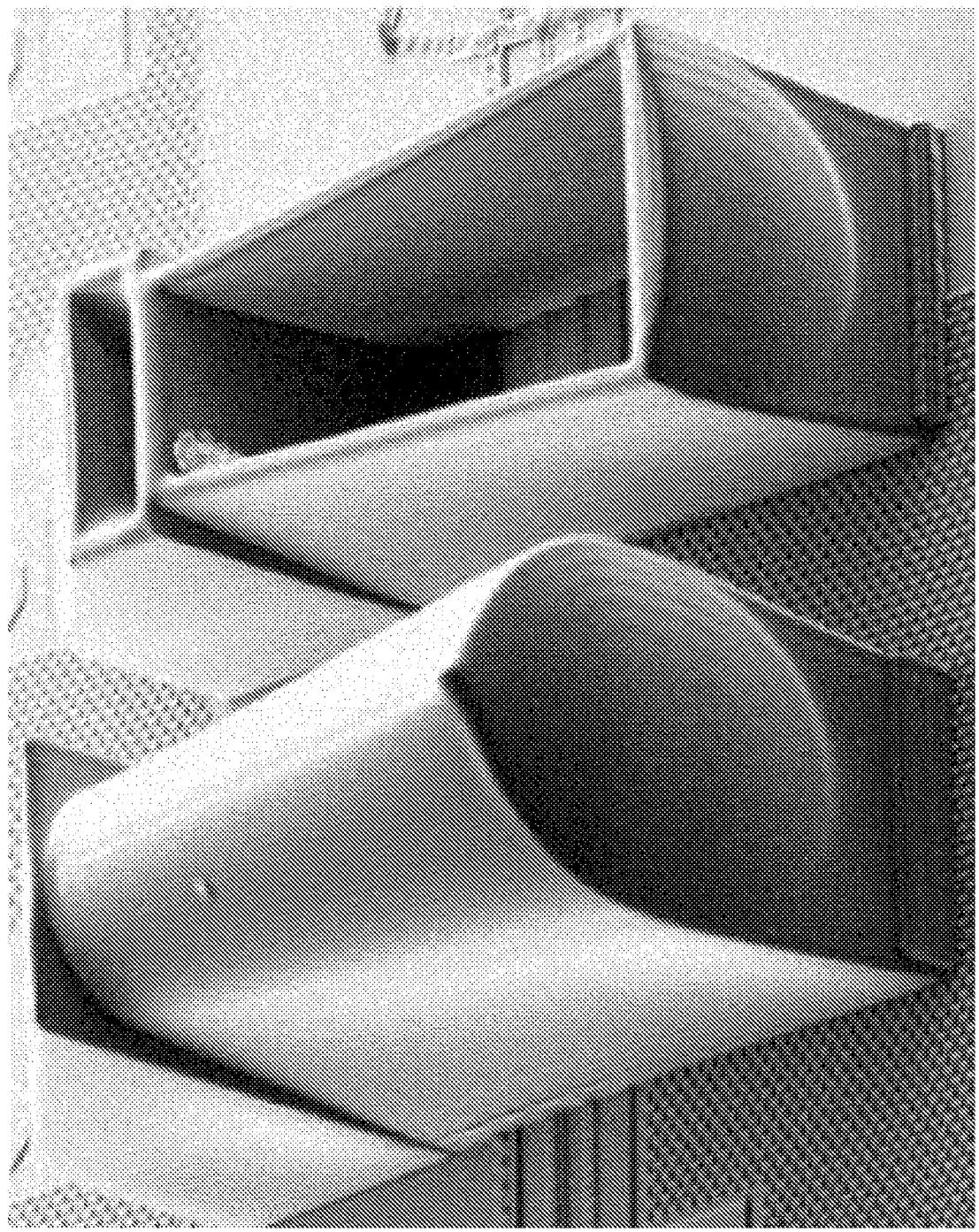
FIG. 9 shows an electron microscope image of beam deflection elements.

Electron microscopic images of two beam deflection elements of basic form A are shown in FIG. 9. The left deflection element is correctly formed, the right one is incomplete (to allow a view to the inside, the uppermost area is cut away and the rest of the element is hollow). A radiation output element is arranged below the rear part of the elements; on its way up, the light beam strikes the inclined surface visible in the back left where it is reflected. It passes diagonally from the back towards the front through the slightly conical body of the element and exits in the front on the curved face.

What is claimed is:

1. A method for producing an optical component, said optical component comprising:
   a substrate having a substrate surface,
   a radiation output element and/or a radiation input element arranged on the substrate surface, and
   a beam deflection element with dimensions of less than 1 mm in all spatial directions which is arranged on the substrate surface on the radiation input element or radiation output element and is designed to deflect electromagnetic radiation exiting the radiation output element essentially vertically with respect to the substrate surface, and thereby forms a beam which is aligned in parallel to the substrate surface or has a smaller or even negative angle with respect to the exit angle formed by the beam exiting the radiation output element with the substrate surface, or such that it focuses electromagnetic radiation entering the beam deflection element with a specific angle with respect to the substrate surface and directs it into the radiation input element,
   wherein the beam deflection element has an entrance face for incident radiation and an exit face for this radiation and at least two further faces distinct from the entrance face and the exit face, said two further faces affecting the path of the radiation passing through the element, one of said two further faces causing a deflection of at least a part of the incident radiation and the other one of said two further faces causing a change in the beam divergence and/or the beam shape, wherein at least one of the entrance face and exit face of the beam deflection element has a planar shape at least partially arranged directly on an exit face of said radiation output element or on an entrance face of said radiation input element, wherein the beam deflection element is produced directly on-site out of a starting material through photo-induced curing of a photo-structurable material, wherein the photo-induced curing is carried out by two-photon absorption or multi-photon absorption, characterized in that the beam deflection element that causes the beam divergence and/or the beam shape to change is a diffractive optical element, a lens, a lens combination, a thin hologram, a volume hologram, a metamaterial or a combination of several of the specified elements on the inside of the beam deflection element, or wherein there is a diffractive optical element on a reflective face of the beam deflection element, wherein the entrance face for incoming radiation and the exit face for this radiation have an angle of between 70 and 110°.

2. The method according to claim 1, wherein the beam deflection element has a two-component or multi-component design, wherein a first part is arranged at least partially directly on a radiation output element or radiation input element on the substrate surface, and a second part is arranged at a position on the substrate surface such that it is necessarily arranged directly in the beam path of the radiation exiting the first part or entering into this part or at least a part thereof, wherein the first part of the beam deflection element has a face which causes a deflection of at least a part of the incident radiation, and the second part of the beam deflection element has a surface which causes a change of the beam divergence and/or the beam shape of the incident beam, or vice versa.

3. The method according to claim 1, wherein the beam deflection element is arranged partially directly on a radiation output element, characterized in that the beam deflection element is further arranged partially directly on a radiation input element which is part of a second optical component, and wherein the beam deflection element has at least two faces which cause a deflection of at least a part of the incident radiation, and at least two faces which cause a change of the beam divergence and/or the beam shape, wherein the faces are arranged with respect to one another such that the beam is guided from the radiation output element of the optical component through the beam deflection element into the radiation input element of the second optical component.

4. The method according to claim 1, further comprising a waveguide, which is arranged either directly adjacent to or spaced from a flat radiation entrance face or radiation exit face of the beam deflection element.

5. The method according to claim 4, wherein the waveguide is arranged at a distance from the flat radiation entrance face or radiation exit face of the beam deflection element, and a space between the flat radiation entrance face or the radiation exit face of the beam deflection element and the waveguide is filled with gas, vacuum, a liquid or a solid, wherein the liquid or the solid has a different refractive index than the material which forms the radiation entrance face or radiation exit surface of the beam deflection element and the material from which the waveguide is formed.

6. The method according to claim 1, wherein the beam deflection element is produced through photo-induced curing of a droplet of the photo-structurable material and wherein at least one additional optical component is produced from the same droplet of photo-structurable material.

7. The method according to claim 6, wherein the additional optical component is a waveguide, which is either arranged directly adjacent to or spaced from a flat radiation entrance face or radiation exit face of the beam deflection element.

8. The method according to claim 1, wherein liquid material remaining after the photostructuring of the beam deflection element is washed away.

9. The method according to claim 8, wherein the additional optical component is a waveguide, wherein a space between the flat radiation entrance face or radiation exit face of the beam deflection element and the waveguide is filled with gas, vacuum, a liquid or a solid after washing the liquid material away, wherein the liquid or the solid has a different refractive index than the material which forms the radiation entrance face or radiation exit face of the beam deflection element and the material from which the waveguide is formed.

10. The method according to claim 6, wherein the total material of the droplet is flooded with light and/or thermally treated and cured, prior to and/or after the photostructuring of the beam deflection element.

* * * * *

UNITED STATES PATENT AND TRADEMARK OFFICE
CERTIFICATE OF CORRECTION

PATENT NO. : 10,809,468 B2
APPLICATION NO. : 15/751770
DATED : October 20, 2020
INVENTOR(S) : Ruth Houbertz and Moritz Esslinger It is certified that error appears in the above-identified patent and that said Letters Patent is hereby corrected as shown below:

In the Claims

Column 22, Claim 9, Line 1: "The method according to claim 8,..." should read --The method according to claim 6,...--

Signed and Sealed this
Fourth Day of May, 2021

Drew Hirshfeld
*Performing the Functions and Duties of the
Under Secretary of Commerce for Intellectual Property and
Director of the United States Patent and Trademark Office*